(12) United States Patent
Misaki

(10) Patent No.: US 11,257,855 B2
(45) Date of Patent: Feb. 22, 2022

(54) IMAGING PANEL AND PRODUCTION METHOD THEREOF

(71) Applicant: Sharp Kabushiki Kaisha, Osaka (JP)

(72) Inventor: Katsunori Misaki, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 57 days.

(21) Appl. No.: 16/808,460

(22) Filed: Mar. 4, 2020

(65) Prior Publication Data
US 2020/0286935 A1    Sep. 10, 2020

Related U.S. Application Data

(60) Provisional application No. 62/815,407, filed on Mar. 8, 2019.

(51) Int. Cl.
*H01L 27/146*    (2006.01)

(52) U.S. Cl.
CPC .... *H01L 27/1462* (2013.01); *H01L 27/14643* (2013.01); *H01L 27/14685* (2013.01); *H01L 27/14692* (2013.01)

(58) Field of Classification Search
CPC ........... H01L 27/1462; H01L 27/14685; H01L 27/14643; H01L 27/14692; H01L 27/14603; H01L 27/14658; H01L 27/14612; H01L 27/14663; H01L 27/14636; H01L 27/14683
See application file for complete search history.

(56) References Cited

U.S. PATENT DOCUMENTS

| 9,343,503 | B2 * | 5/2016 | Okada | H01L 27/1463 |
| 2013/0264485 | A1 * | 10/2013 | Kawanabe | G01T 1/24 250/369 |
| 2014/0103347 | A1 * | 4/2014 | Ishino | H01L 27/14689 257/59 |
| 2017/0236856 | A1 * | 8/2017 | Tomiyasu | H01L 21/8234 378/91 |
| 2017/0357011 | A1 * | 12/2017 | Tomiyasu | G01N 23/04 |

FOREIGN PATENT DOCUMENTS

| JP | 2011-159781 A | 8/2011 |
| JP | 2014-078651 A | 5/2014 |

* cited by examiner

*Primary Examiner* — Jonathan Han
(74) *Attorney, Agent, or Firm* — Keating & Bennett, LLP

(57) ABSTRACT

An imaging panel includes a photoelectric conversion layer. The surface of the photoelectric conversion layer is partly covered with an inorganic insulating film having a first opening above the photoelectric conversion layer. An organic insulating film having a second opening having a larger opening width than the first opening is disposed on the inorganic insulating film. A surface of the inorganic insulating film that is not covered with the organic insulating film is covered with the protection film at the inside of the second opening. The etching rate of the protection film upon etching with an etchant containing an acid is equal to or higher than that of the inorganic insulating film. The surface of the photoelectric conversion layer at the first opening and the surface of the protection film are covered with an electrode.

4 Claims, 22 Drawing Sheets

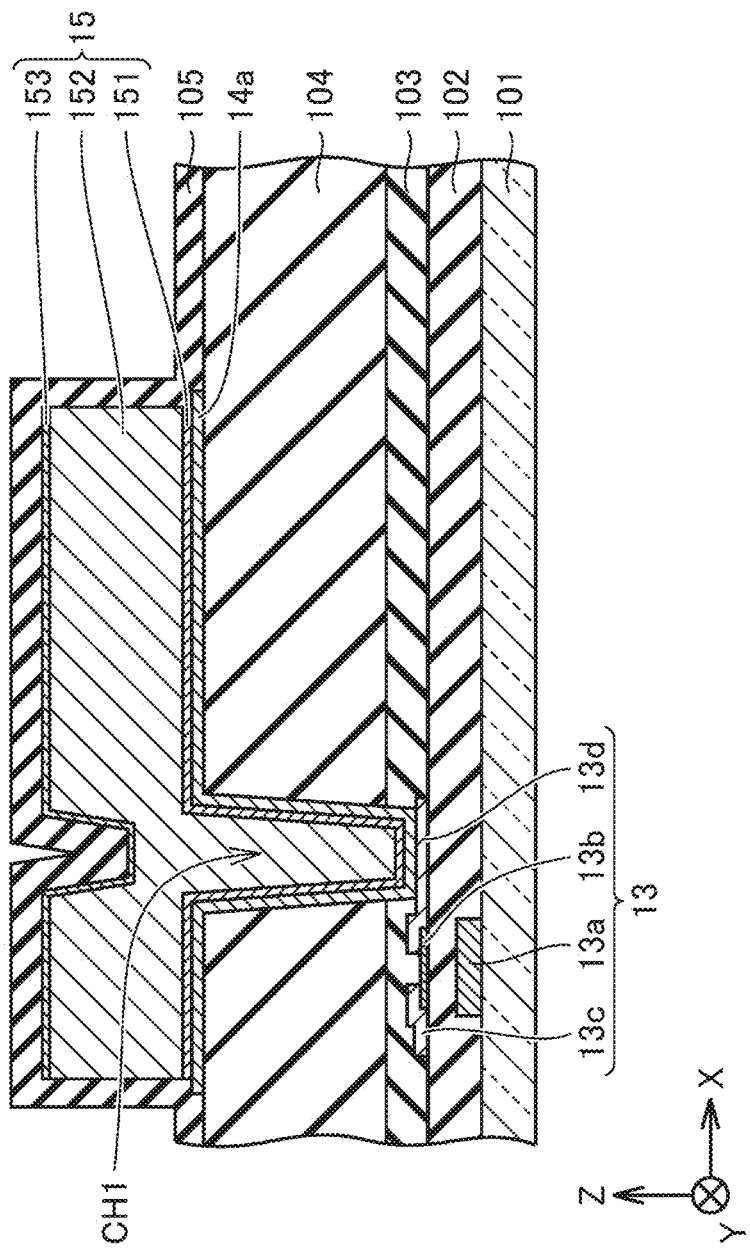

US 11,257,855 B2

IMAGING PANEL AND PRODUCTION METHOD THEREOF

The present disclosure contains subject matter related to that disclosed in U.S. Provisional Patent Application No. 62/815,407 filed in the U.S. Patent Office on Mar. 8, 2019, the entire contents of which are hereby incorporated by reference.

BACKGROUND

1. Field

The present disclosure relates to an imaging panel and a method for producing the imaging panel.

2. Description of the Related Art

Japanese Unexamined Patent Application Publication No. 2011-159781 discloses a photoelectric conversion device in which photodiodes serving as photoelectric conversion elements and thin film transistors (hereafter also referred to as "TFTs") are arranged in a matrix. Such a photodiode includes a pair of electrodes. One of the electrodes is connected to a TFT and the other is connected to a bias wire.

In the photodiode, a semiconductor layer serving as a photoelectric conversion layer is disposed between the pair of electrodes as described above. When a photoelectric conversion device is produced, one electrode is formed, a semiconductor layer is formed, and then the other electrode is formed on the semiconductor layer. If an electrode is formed while a native oxide adheres to the surface of the semiconductor layer, contact failure or the like is easily caused between the electrode and the semiconductor layer. Therefore, the surface of the semiconductor layer is desirably cleaned using hydrofluoric acid or the like before formation of the electrode. However, when the surface of the photodiode is partly covered with an insulating film formed of silicon nitride or the like and a planarizing film is disposed on the insulating film as in the above photoelectric conversion device, the surface of the insulating film is partly etched through cleaning treatment, which may result in formation of steps or gaps between the planarizing film and the insulating film. If an electrode is formed on the semiconductor layer in this state, the electrode tends to be discontinuously formed at portions such as steps or gaps formed between the planarizing film and the insulating film. Such discontinuous portions in the electrode cause contact failure between the electrode and the semiconductor layer, and thus an appropriate detection result is not obtained.

The present disclosure provides an imaging panel in which contact failure between a photoelectric conversion layer and an electrode is not easily caused and detection failure is not easily caused.

SUMMARY

According to an aspect of the disclosure, there is provided an imaging panel that addresses the above problem including a photoelectric conversion layer; an inorganic insulating film partly covering a surface of the photoelectric conversion layer and having a first opening at a position that overlaps the photoelectric conversion layer in plan view; an organic insulating film partly covering a surface of the inorganic insulating film and having a second opening that overlaps the first opening in plan view and that has a larger opening width than the first opening; a protection film covering a portion of the inorganic insulating film, the portion being not covered with the organic insulating film, at an inside of the second opening; and an electrode covering the protection film and a surface of the photoelectric conversion layer at an inside of the first opening, wherein the protection film has an etching rate equal to or higher than that of the inorganic insulating film upon etching with an etchant containing an acid.

BRIEF DESCRIPTION OF THE DRAWINGS

FIG. 5I is a sectional view illustrating a step of forming a third insulating film;

FIG. 5O is a sectional view illustrating a step of patterning the protection film to form an opening above the bias wire;

DESCRIPTION OF THE EMBODIMENTS

Figure 1:
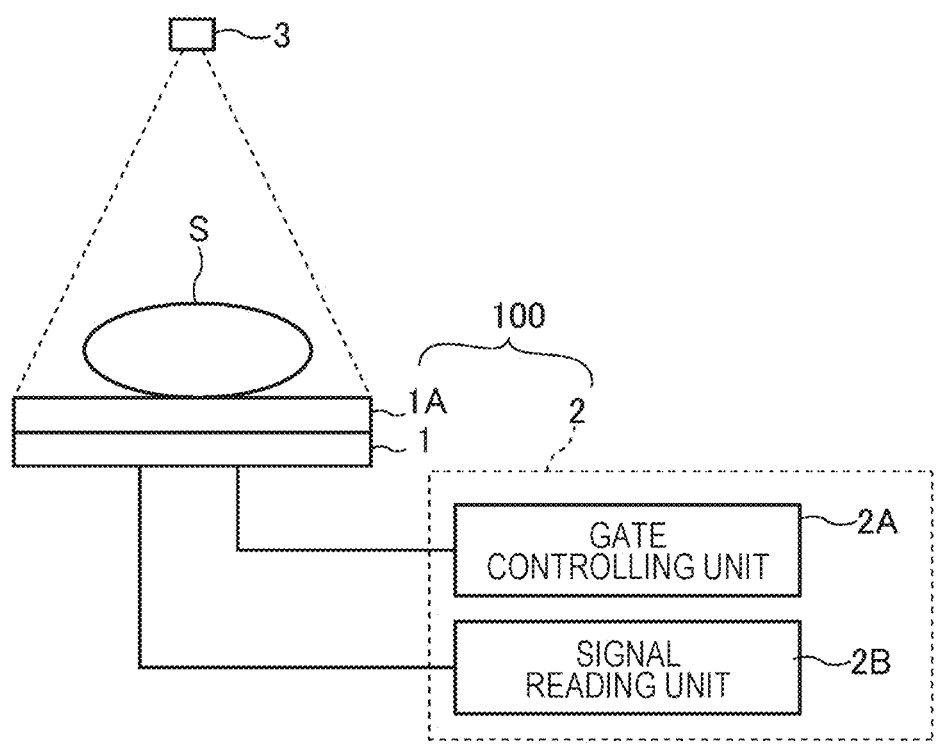
FIG. 1 schematically illustrates the configuration of an X-ray imaging device according to a first embodiment.

Hereafter, embodiments of the present disclosure will be described in detail with reference to the attached drawings. In the drawings, the same or corresponding parts are designated by the same reference numerals, and the description thereof is omitted.

First Embodiment

Configuration

FIG. 1 schematically illustrates an X-ray imaging device according to this embodiment. An X-ray imaging device 100 includes an imaging panel 1, a scintillator 1A, and a controller 2. The controller 2 includes a gate controlling unit 2A and a signal reading unit 2B. An X-ray source 3 is disposed above the scintillator 1A, and X-rays are applied from the X-ray source 3. The scintillator 1A converts X-rays into fluorescence (hereafter, scintillation light). The imaging panel 1 receives scintillation light and converts the scintillation light into a charge. The controller 2 controls the gate controlling unit 2A and the signal reading unit 2B to read an electric current based on the charge obtained by conversion at the imaging panel 1, thereby obtaining an X-ray image based on the electric current. Hereafter, the configuration of the imaging panel 1 will be specifically described.

Figure 2:
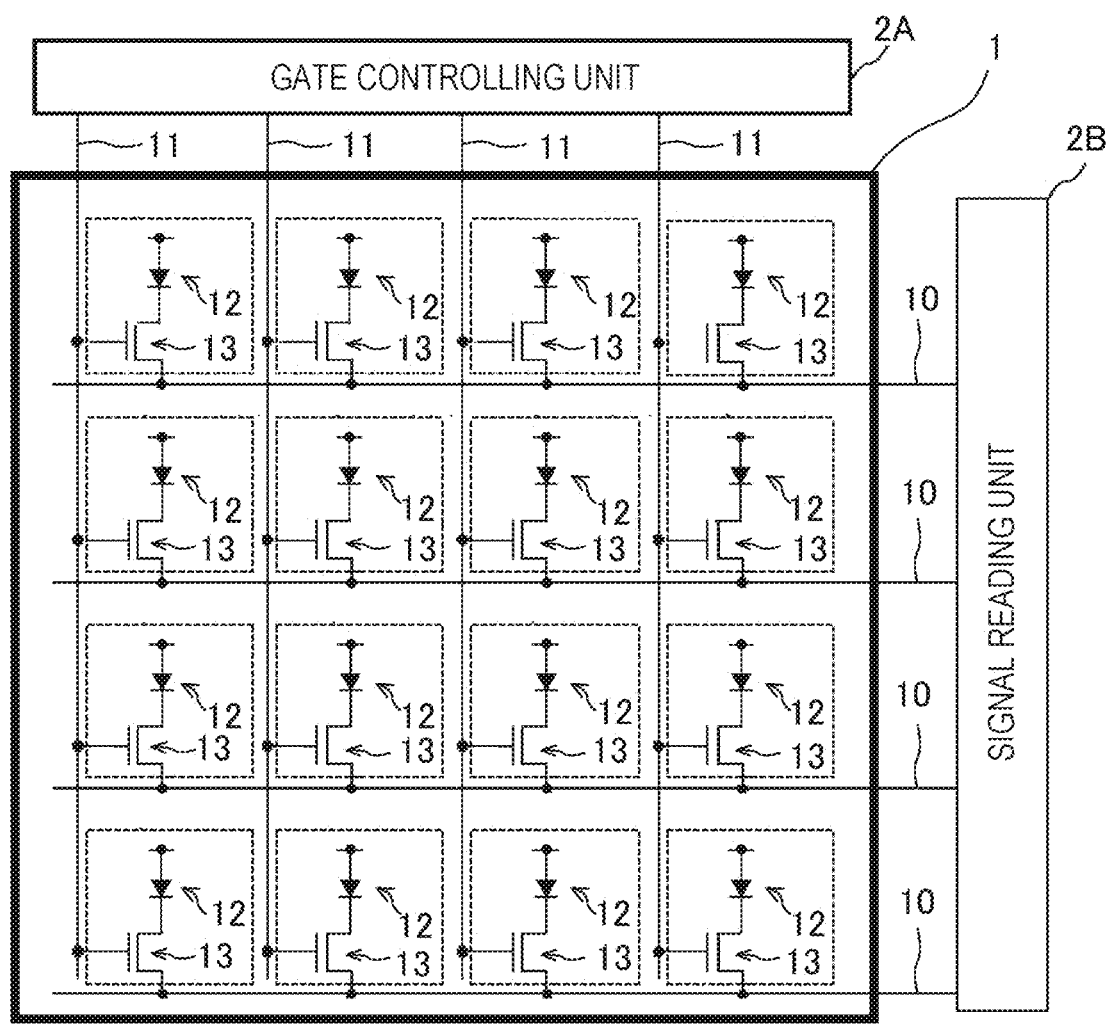
FIG. 2 schematically illustrates the configuration of an imaging panel illustrated in FIG. 1.

FIG. 2 schematically illustrates the configuration of the imaging panel 1. As illustrated in FIG. 2, a plurality of source wires 10 and a plurality of gate wires 11 that intersect the plurality of source wires 10 are formed on the imaging panel 1. The gate wires 11 are connected to the gate controlling unit 2A, and the source wires 10 are connected to the signal reading unit 2B.

The imaging panel 1 includes TFTs 13 connected to the source wires 10 and the gate wires 11 at positions at which the source wires 10 and the gate wires 11 intersect each other. Photodiodes 12 are disposed in regions (hereafter, pixels) surrounded by the source wires 10 and the gate wires 11. In each of the pixels, scintillation light obtained by converting X-rays transmitted through a subject S is converted into a charge based on the amount of the scintillation light at the photodiode 12.

Each of the gate wires 11 is sequentially switched to a selected state by the gate controlling unit 2A, and TFTs 13 connected to the gate wires 11 in a selected state are in an ON-state. When the TFTs 13 are in an ON-state, a signal based on the charge obtained by conversion at the photodiode 12 is output to the signal reading unit 2B through the source wires 10.

Figure 3:
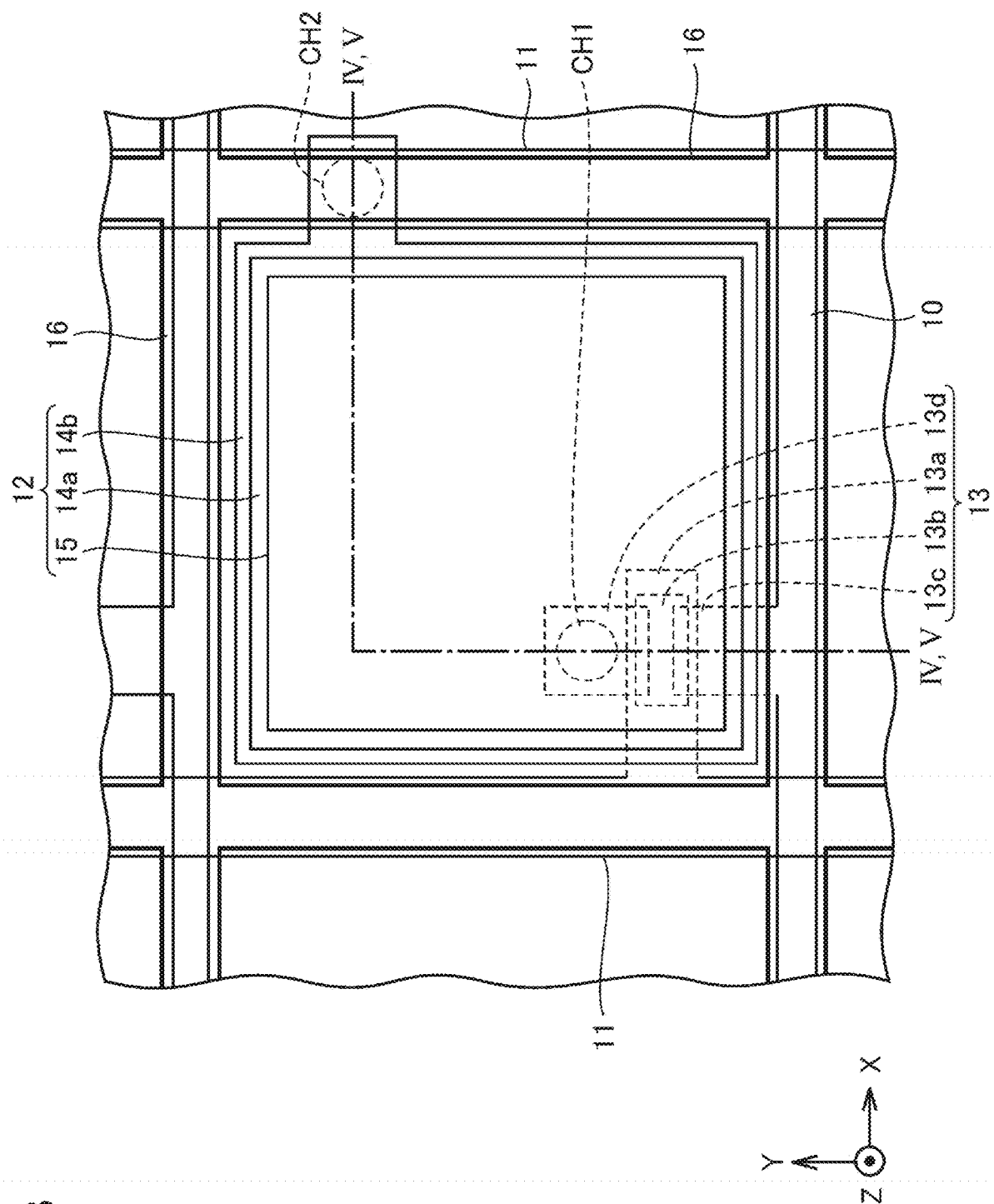
FIG. 3 is an enlarged plan view of one pixel of the imaging panel illustrated in FIG. 2.

FIG. 3 is an enlarged plan view of one pixel portion of the imaging panel 1 illustrated in FIG. 2. As illustrated in FIG. 3, the photodiode 12 and the TFT 13 are disposed in a pixel surrounded by the gate wires 11 and the source wires 10. The photodiode 12 includes a lower electrode (cathode electrode) 14a, an upper electrode (anode electrode) 14b, and a photoelectric conversion layer 15.

The upper electrode 14b is disposed above the photoelectric conversion layer 15, that is, on the side on which X-rays are applied from the X-ray source 3 (refer to FIG. 1).

The TFT 13 includes a gate electrode 13a, a semiconductor active layer 13b, a source electrode 13c, and a drain electrode 13d. In this example, the gate electrode 13a is integrally formed with the gate wire 11 and the source electrode 13c is integrally formed with the source wire 10. However, the gate electrode 13a and the gate wire 11 may be formed so as to be independent of each other, and the source electrode 13c and the source wire 10 may be formed so as to be independent of each other.

Bias wires 16 are disposed so as to overlap the gate wires 11 and the source wires 10 in plan view. The bias wires 16 supply a bias voltage to the photodiodes 12.

Figure 4:
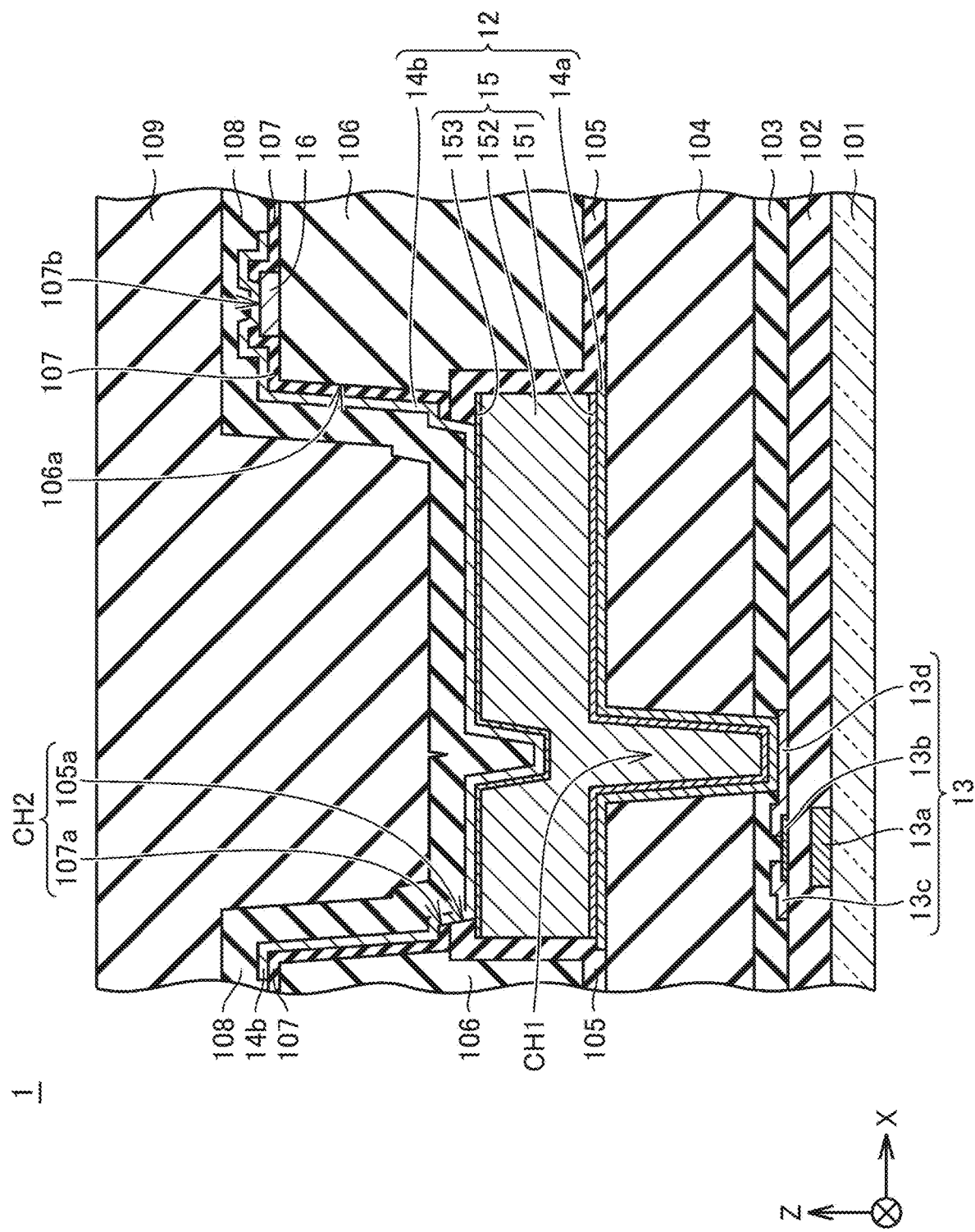
FIG. 4 is a sectional view of a pixel taken along line IV-IV in FIG. 3.

FIG. 4 is a sectional view taken along line IV-IV in FIG. 3. Hereafter, in FIG. 4, the portion in a positive Z-axis direction may be referred to as an upper portion and the portion in a negative Z-axis direction may be referred to as a lower portion for the sake of convenience of description.

As illustrated in FIG. 4, each element at the pixel is disposed on a substrate 101. The substrate 101 is an insulating substrate such as a glass substrate.

The gate electrode 13a and a gate insulating film 102 are formed on the substrate 101.

The gate electrode 13a is formed of, for example, a metal such as aluminum (Al), tungsten (W), molybdenum (Mo), molybdenum nitride (MoN), tantalum (Ta), chromium (Cr), titanium (Ti), or copper (Cu); an alloy of the foregoing metals; or a nitride of the foregoing metals. In this embodiment, the gate electrode 13a is a multilayer film obtained by forming a metal film made of aluminum (Al) as a lower layer and a metal film made of molybdenum nitride (MoN) as an upper layer. For example, the thickness of the molybdenum nitride (MoN) is about 100 nm and the thickness of the aluminum (Al) is about 300 nm.

The gate insulating film 102 covers the gate electrode 13a. The gate insulating film 102 is formed of, for example, silicon oxide ($SiO_x$), silicon nitride ($SiN_x$), silicon oxynitride ($SiO_xN_y$) (x>y), or silicon oxynitride ($SiN_xO_y$) (x>y). In this embodiment, the gate insulating film 102 is a multilayer film obtained by forming an inorganic insulating film made of silicon nitride ($SiN_x$) as a lower layer and an inorganic insulating film made of silicon oxide ($SiO_x$) as an upper layer. For example, the thickness of the silicon oxide ($SiO_x$) is about 50 nm and the thickness of the silicon nitride ($SiN_x$) is about 400 nm.

The semiconductor active layer 13b is disposed above the gate electrode 13a with the gate insulating film 102 interposed therebetween. Portions of the semiconductor active layer 13b are covered with the source electrode 13c and the drain electrode 13d, and the source electrode 13c and the drain electrode 13d are spaced apart on the semiconductor active layer 13b.

The semiconductor active layer 13b is formed in contact with the gate insulating film 102. The semiconductor active layer 13b is formed of an oxide semiconductor. The oxide semiconductor may be, for example, $InGaO_3(ZnO)_5$, magnesium zinc oxide ($Mg_xZn_{1-x}O$), cadmium zinc oxide ($Cd_xZn_{1-x}O$), or cadmium oxide (CdO) or may be, for example, an amorphous oxide semiconductor containing indium (In), gallium (Ga), and zinc (Zn) at a particular ratio. In this embodiment, the semiconductor active layer 13b is formed of an amorphous oxide semiconductor containing indium (In), gallium (Ga), and zinc (Zn) at a particular ratio. The semiconductor active layer 13b has a thickness of, for example, 70 nm.

The source electrode 13c and the drain electrode 13d are formed of, for example, a metal such as aluminum (Al), tungsten (W), molybdenum (Mo), tantalum (Ta), chromium (Cr), titanium (Ti), or copper (Cu); an alloy of the foregoing metals; or a nitride of the foregoing metals. The material for the source electrode 13c and the drain electrode 13d may be a material having transparency, such as indium tin oxide (ITO), indium zinc oxide (IZO), indium tin oxide (ITSO) containing silicon oxide, indium oxide ($In_2O_3$), tin oxide ($SnO_2$), zinc oxide (ZnO), or titanium nitride or a material obtained by appropriately combining the foregoing materials. The source electrode 13c and the drain electrode 13d may be formed by, for example, forming a plurality of metal films on top of each other. In this embodiment, the source electrode 13c and the drain electrode 13d have a multilayer structure in which a metal film made of molybdenum nitride (MoN), a metal film made of aluminum (Al), and a metal film made of molybdenum nitride (MoN) are formed in this order. In this example, the metal film made of molybdenum nitride (MoN) as a lower layer has a thickness of about 100 nm, the metal film made of aluminum (Al) has a thickness of about 500 nm, and the metal film made of molybdenum nitride (MoN) as an upper layer has a thickness of about 50 nm.

A first insulating film 103 is disposed so as to cover the source electrode 13c and the drain electrode 13d. In this example, the first insulating film 103 is a multilayer film obtained by forming an inorganic insulating film made of silicon oxide ($SiO_2$) as a lower layer and an inorganic insulating film made of silicon nitride (SiN) as an upper layer. For example, the inorganic insulating film made of silicon nitride (SiN) has a thickness of about 330 nm, and the inorganic insulating film made of silicon oxide ($SiO_2$) has a thickness of about 200 nm. The first insulating film 103 may have a single-layer structure formed of silicon oxide ($SiO_2$) or silicon nitride (SiN).

A second insulating film 104 is formed on the first insulating film 103. The second insulating film 104 is formed of an organic transparent resin such as acrylic resin or siloxane resin. The second insulating film 104 has a thickness of, for example, about 2.5 μm.

A contact hole CH1 is formed above the drain electrode 13d. The contact hole CH1 extends through the second insulating film 104 and the first insulating film 103.

A lower electrode 14a is formed on the second insulating film 104. The lower electrode 14a is connected to the drain electrode 13d through the contact hole CH1. In this example, the lower electrode 14a is a metal film formed of molybdenum nitride (MoN). The lower electrode 14a has a thickness of, for example, about 200 nm. The material for the lower electrode 14a is not limited to the above material, and it is sufficient that the lower electrode 14a is formed of a metal material having electrical conductivity.

A photoelectric conversion layer 15 is formed on the lower electrode 14a. The photoelectric conversion layer 15 has a multilayer structure in which an n-type amorphous semiconductor layer 151, an intrinsic amorphous semiconductor layer 152, and a p-type amorphous semiconductor layer 153 are formed in this order. In this example, the length of the photoelectric conversion layer 15 in the X-axis direction is smaller than that of the lower electrode 14a in the X-axis direction.

The n-type amorphous semiconductor layer 151 is formed of amorphous silicon doped with an n-type impurity (e.g., phosphorus). In this example, the n-type amorphous semiconductor layer 151 has a thickness of about 30 nm.

The intrinsic amorphous semiconductor layer 152 is formed of intrinsic amorphous silicon. The intrinsic amorphous semiconductor layer 152 is formed in contact with the n-type amorphous semiconductor layer 151. The intrinsic amorphous semiconductor layer 152 has a thickness of about 1000 nm.

The p-type amorphous semiconductor layer 153 is formed of amorphous silicon doped with a p-type impurity (e.g., boron). The p-type amorphous semiconductor layer 153 is formed in contact with the intrinsic amorphous semiconductor layer 152. The p-type amorphous semiconductor layer 153 has a thickness of about 5 nm.

The materials and thicknesses of the photoelectric conversion layer 15 are not limited to the above-described materials and thicknesses. It is sufficient that the photoelectric conversion layer 15 is a semiconductor layer having a pn junction.

A third insulating film 105 is disposed on the second insulating film 104. The third insulating film 105 has an opening 105a at a position that overlaps the photoelectric conversion layer 15 in plan view and covers the side surfaces of the lower electrode 14a and a part of the upper surface and the side surfaces of the photoelectric conversion layer 15. In other words, the third insulating film 105 covers a part of the surface of the photoelectric conversion layer 15. In this example, the third insulating film 105 is an inorganic insulating film formed of silicon nitride (SiN). The third insulating film 105 has a thickness of about 300 nm. The configuration of the third insulating film 105 is not limited to the above configuration as long as the third insulating film 105 is an inorganic insulating film.

A fourth insulating film 106 is disposed on the third insulating film 105. The fourth insulating film 106 has an opening 106a having a larger opening width than the opening 105a of the third insulating film 105. The fourth insulating film 106 is formed of an organic transparent resin such as acrylic resin or siloxane resin. In this example, the fourth insulating film 106 has a thickness of about 2.5 μm. The configuration of the fourth insulating film 106 is not limited to the above configuration as long as the fourth insulating film 106 is an organic insulating film.

The bias wire 16 is disposed on the fourth insulating film 106 at a position that does not overlap the photoelectric conversion layer 15 in plan view. In this example, the bias wire 16 is, for example, a multilayer film obtained by forming a metal film made of molybdenum nitride (MoN), a metal film made of aluminum (Al), and a metal film made of molybdenum nitride (MoN) in this order. The thickness of the molybdenum nitride (MoN) serving as a lower layer is about 100 nm, the thickness of the aluminum (Al) is about 300 nm, and the thickness of the molybdenum nitride (MoN) serving as an upper layer is about 50 nm.

A protection film 107 is disposed on the third insulating film 105 and the fourth insulating film 106. The protection film 107 has an opening 107a above the photoelectric conversion layer 15, and covers the inner surface of the opening 106a of the fourth insulating film 106 and a part of the surface of the fourth insulating film 106 outside the opening 106a. The protection film 107 is separated above the bias wire 16 and has an opening 107b above the bias wire 16.

In this example, the protection film 107 may be formed of silicon nitride (SiN) or amorphous silicon (a-Si). The protection film 107 preferably has a thickness of about 200 nm when formed of silicon nitride (SiN) and preferably has a thickness of about 100 nm when formed of amorphous silicon (a-Si).

A contact hole CH2 constituted by the opening 107a of the protection film 107 and the opening 105a of the third insulating film 105 is formed above the p-type amorphous semiconductor layer 153 of the photoelectric conversion layer 15.

An upper electrode 14b is formed on the p-type amorphous semiconductor layer 153 and the protection film 107. The upper electrode 14b is in contact with the bias wire 16 through the opening 107b of the protection film 107 and is in contact with the p-type amorphous semiconductor layer 153 through the contact hole CH2. In this embodiment, the upper electrode 14b is formed of, for example, ITO (indium tin oxide) and the upper electrode 14b has a thickness of about 70 nm. The configuration of the upper electrode 14b is not limited to the above configuration as long as the upper electrode 14b is a conductive film.

A fifth insulating film 108 is formed on the upper electrode 14b. The fifth insulating film 108 covers the surfaces of the upper electrode 14b and the protection film 107. In this embodiment, the fifth insulating film 108 is, for example, an inorganic insulating film formed of silicon nitride (SiN), and the fifth insulating film 108 has a thickness of about 200 nm. The configuration of the fifth insulating film 108 is not limited to the above configuration as long as the fifth insulating film 108 is an inorganic insulating film.

A sixth insulating film 109 is formed on the fifth insulating film 108. The sixth insulating film 109 covers the surface of the fifth insulating film 108. The sixth insulating film 109 is formed of an organic transparent resin such as acrylic resin or siloxane resin, and the sixth insulating film 109 has a thickness of about 2.0 μm. The configuration of the sixth insulating film 109 is not limited to the above configuration as long as the sixth insulating film 109 is an organic insulating film.

Method for Producing Imaging Panel 1

Figure 5A:
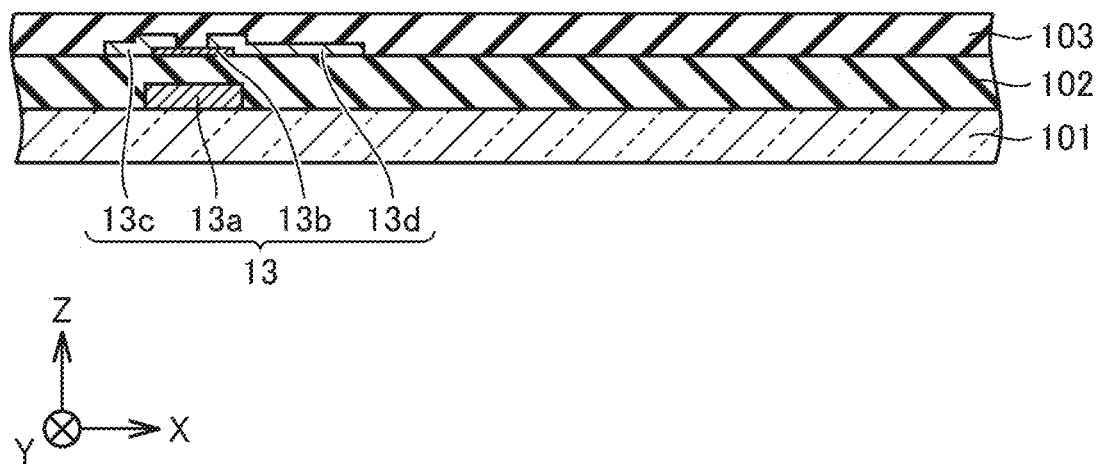
FIG. 5A is a sectional view illustrating the production process of the imaging panel in FIG. 4, and is a sectional view illustrating a step of forming a first insulating film on a TFT.
Figure 5B:
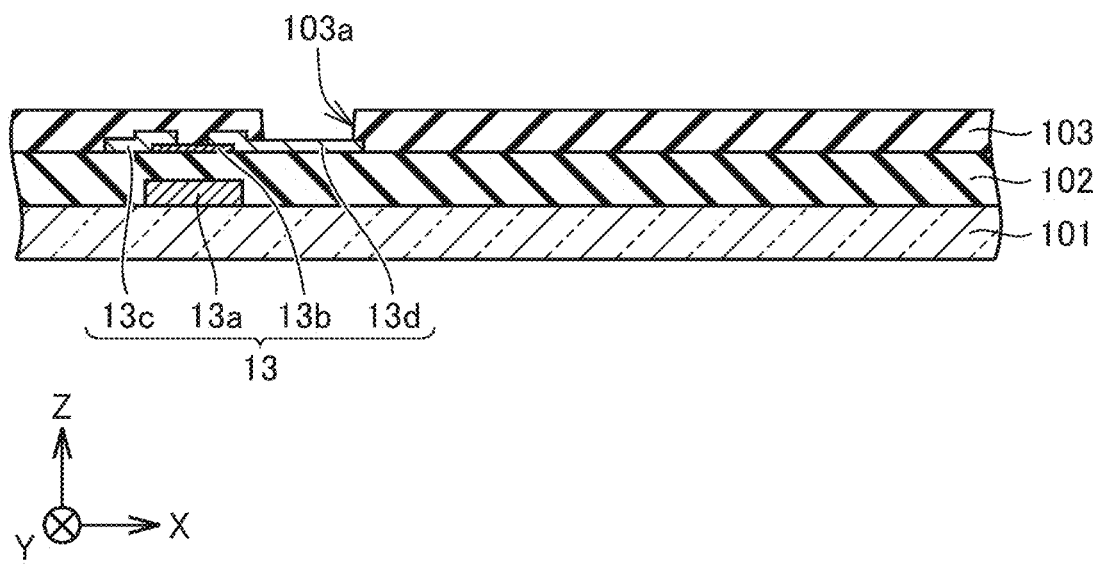
FIG. 5B is a sectional view illustrating a step of forming an opening of the first insulating film.
Figure 5C:
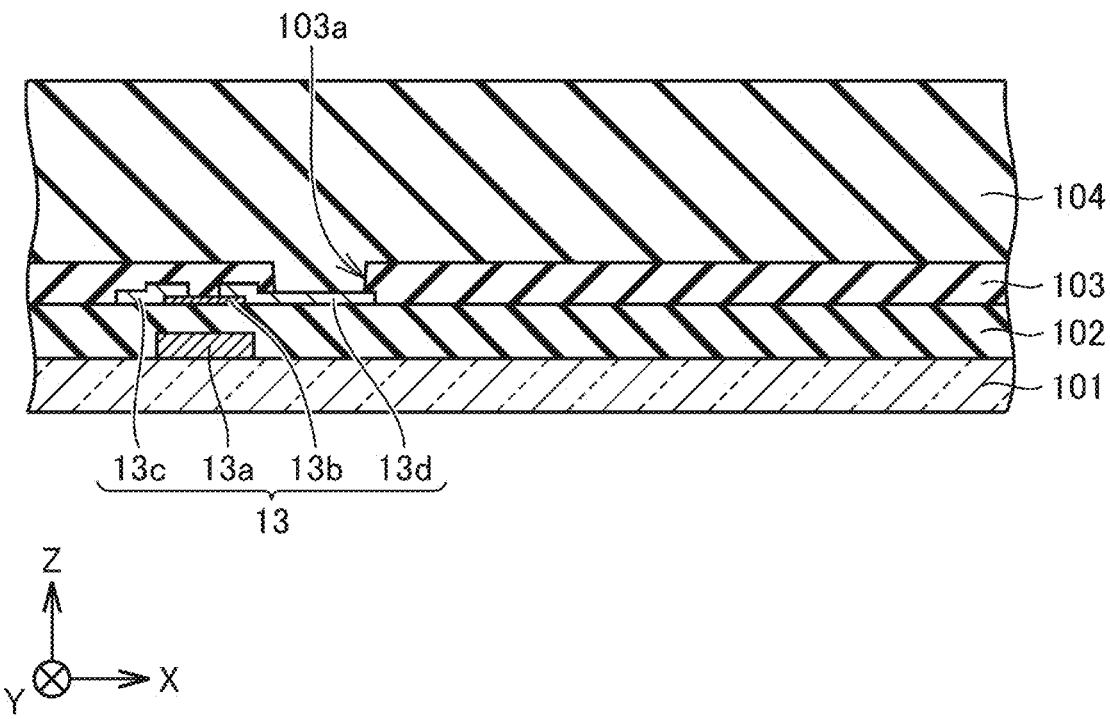
FIG. 5C is a sectional view illustrating a step of forming a second insulating film.
Figure 5D:
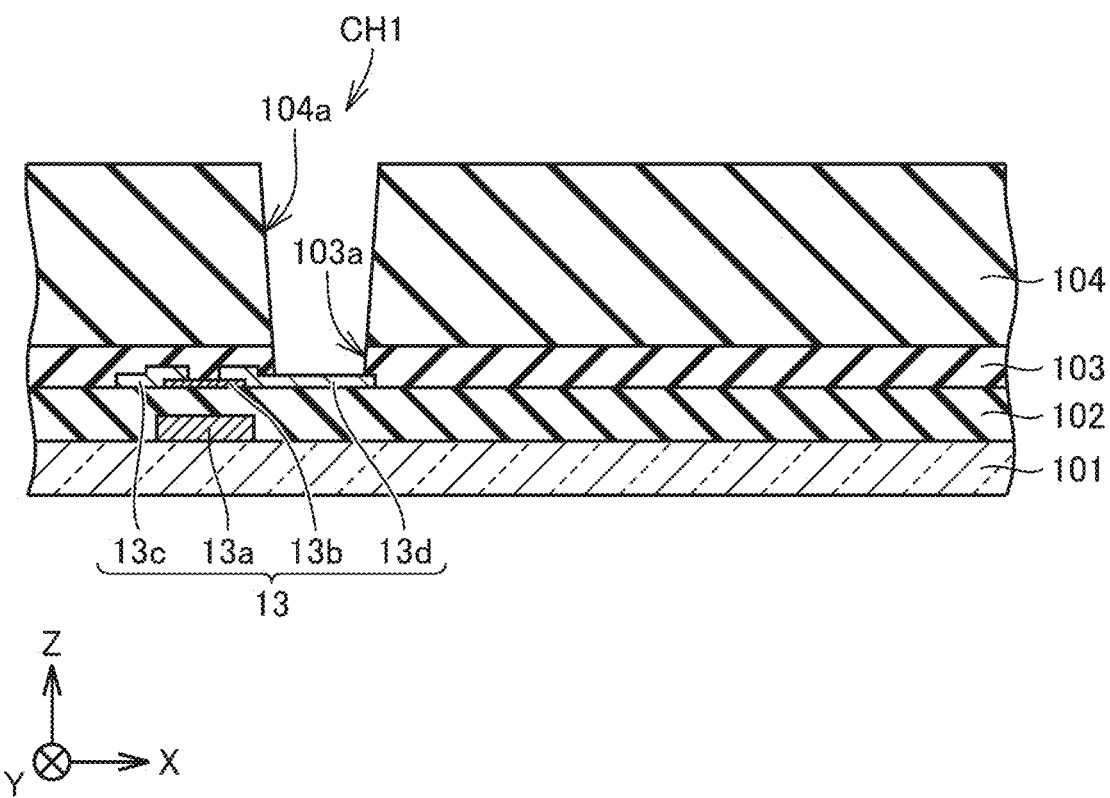
FIG. 5D is a sectional view illustrating a step of forming an opening of the second insulating film.
Figure 5E:
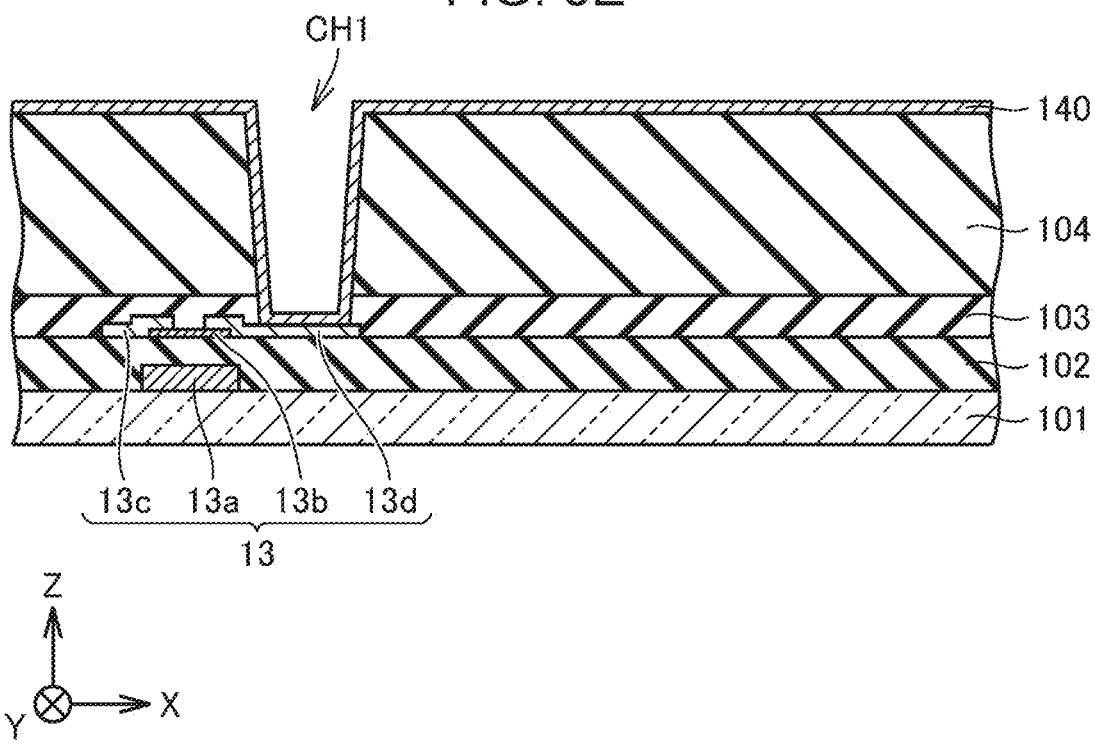
FIG. 5E is a sectional view illustrating a step of forming a metal film serving as a lower electrode.
Figure 5F:
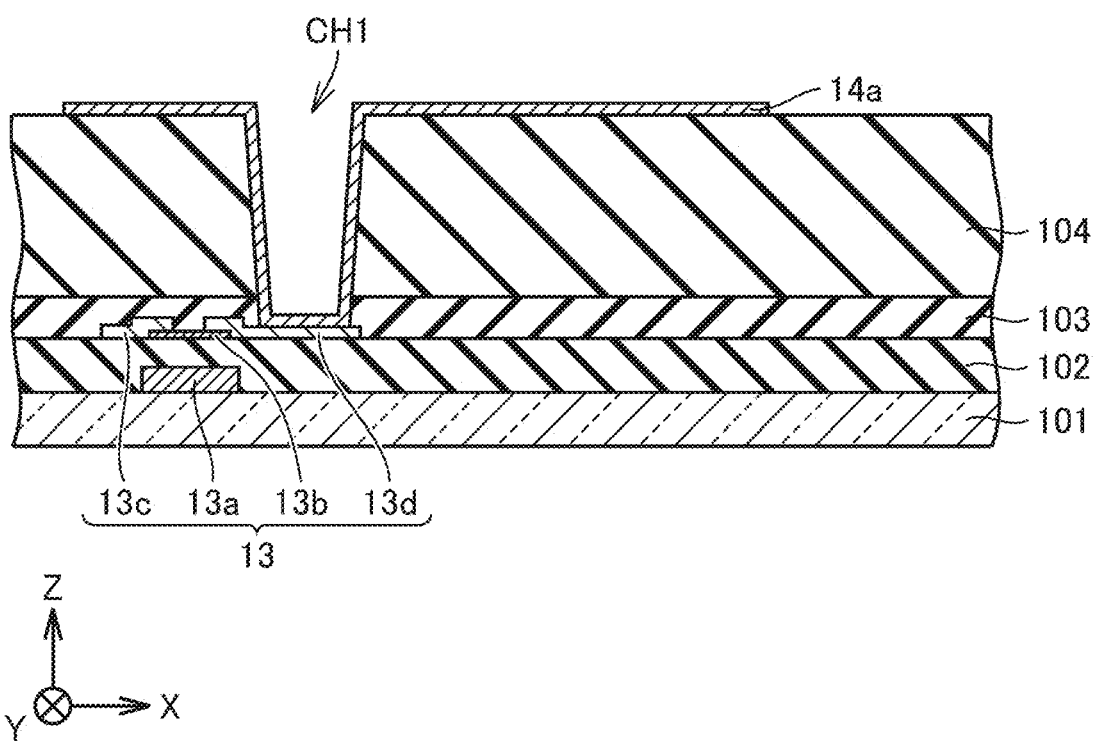
FIG. 5F is a sectional view illustrating a step of forming a lower electrode.
Figure 5G:
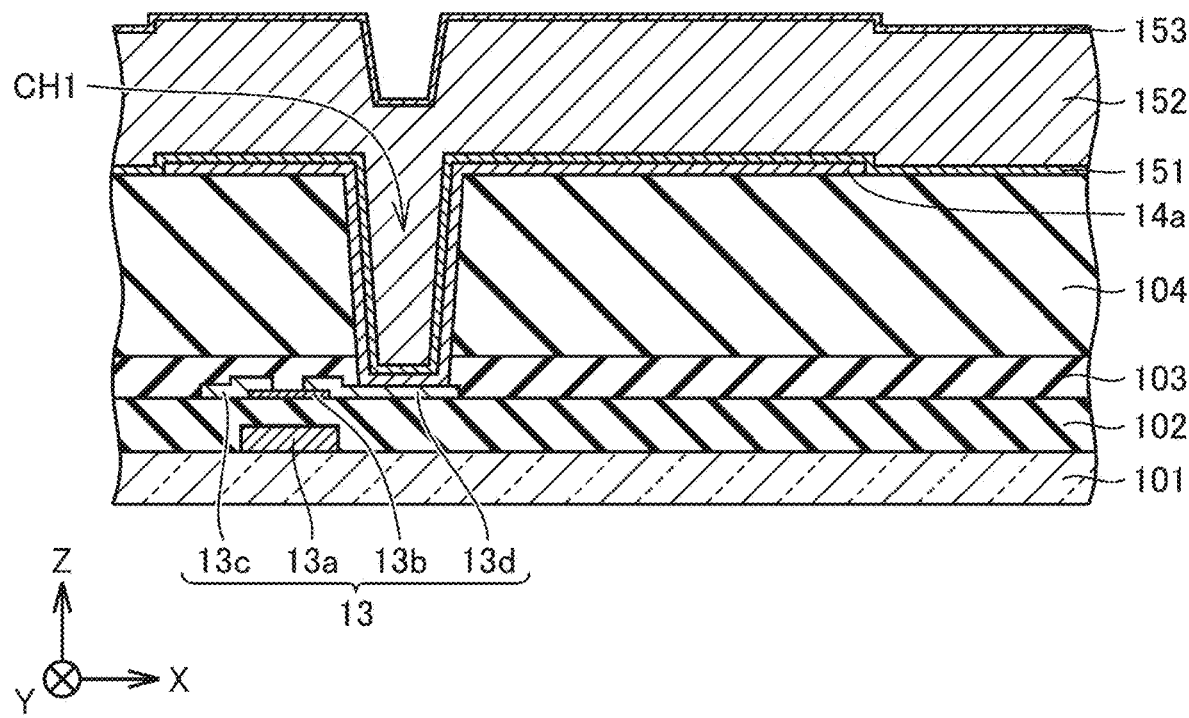
FIG. 5G is a sectional view illustrating a step of forming an n-type amorphous semiconductor layer, an intrinsic amorphous semiconductor layer, and a p-type amorphous semiconductor layer to constitute a photoelectric conversion layer.
Figure 5H:
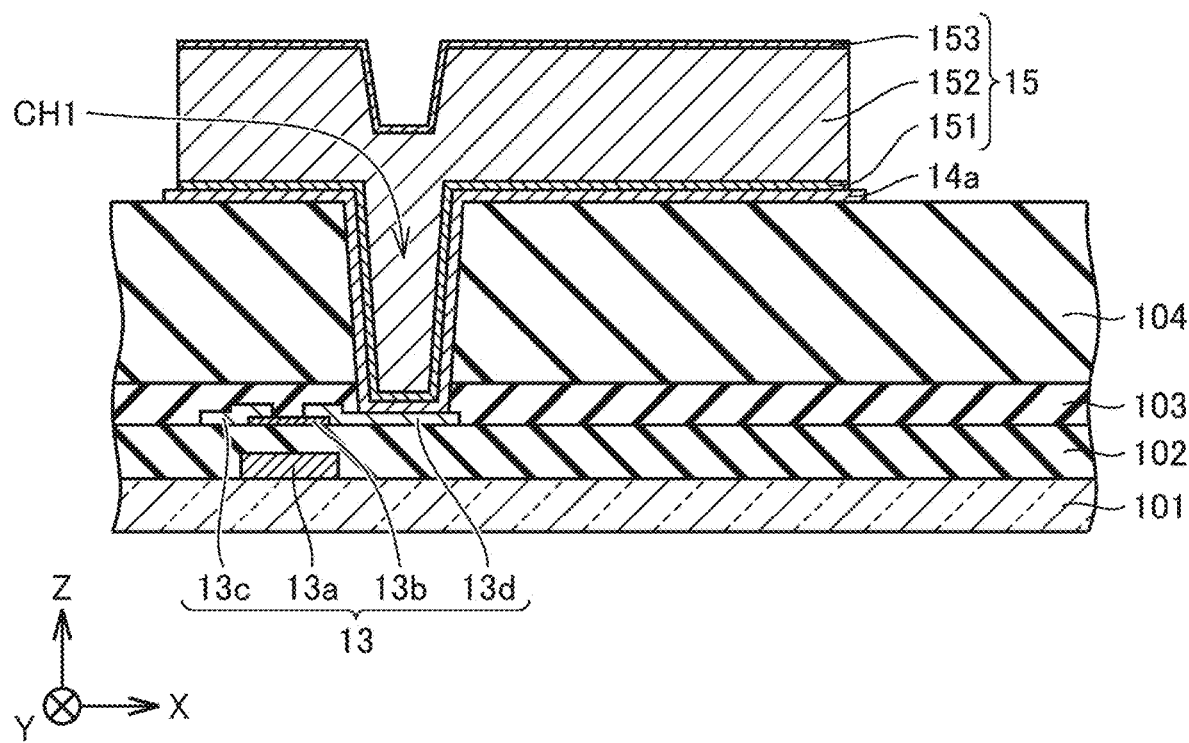
FIG. 5H is a sectional view illustrating a step of forming a photoelectric conversion layer.
Figure 5J:
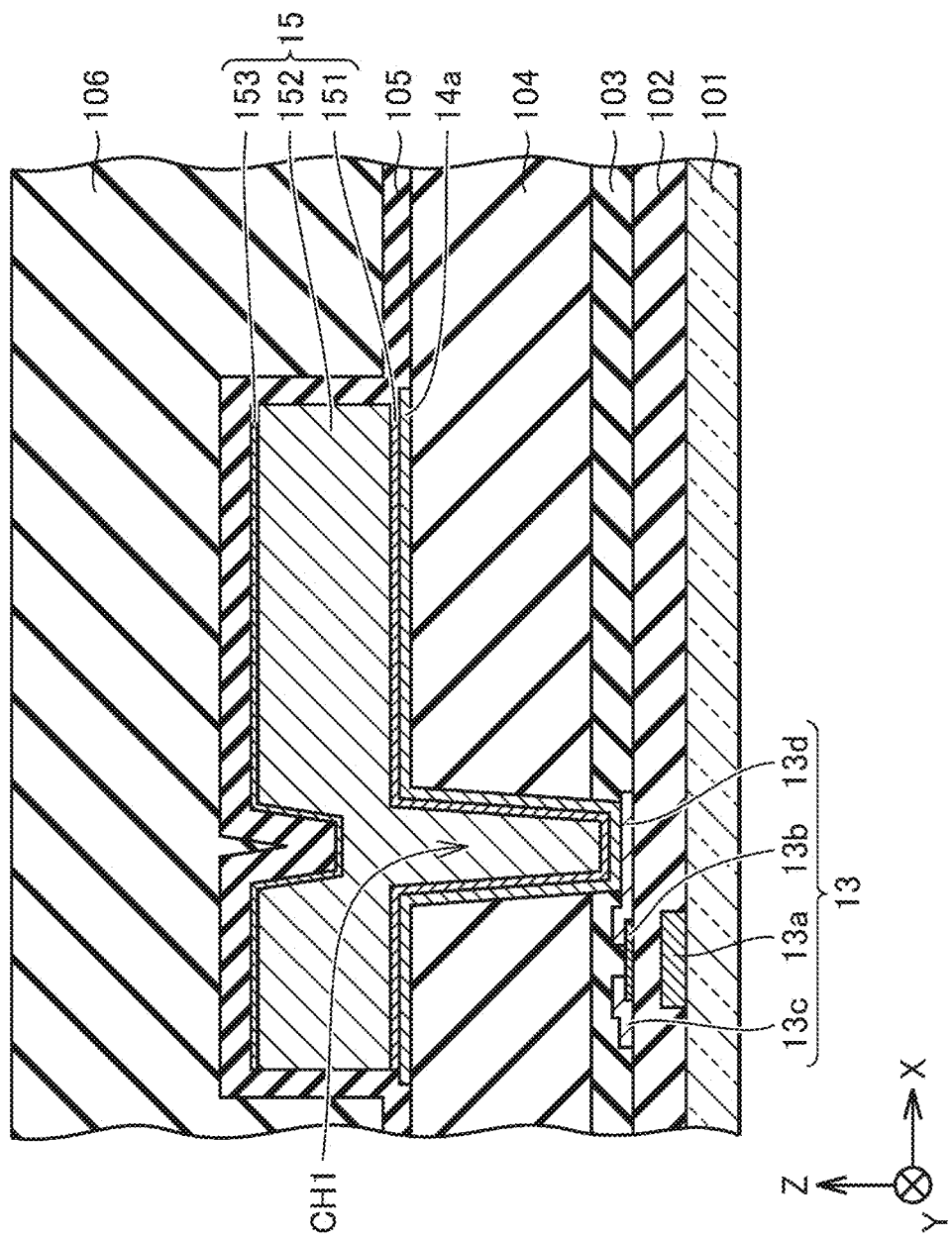
FIG. 5J is a sectional view illustrating a step of forming a fourth insulating film.
Figure 5K:
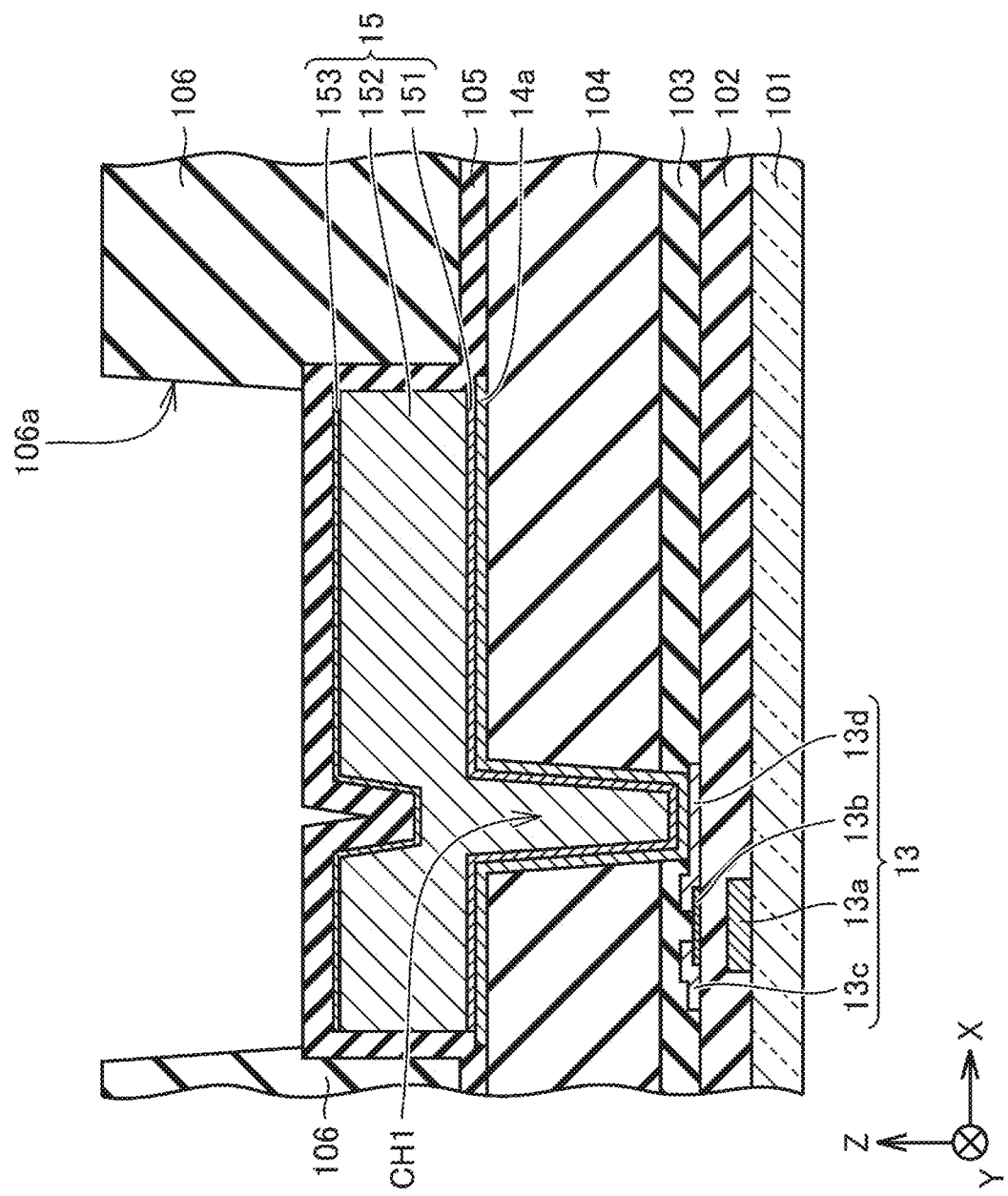
FIG. 5K is a sectional view illustrating a step of forming an opening of the fourth insulating film.
Figure 5L:
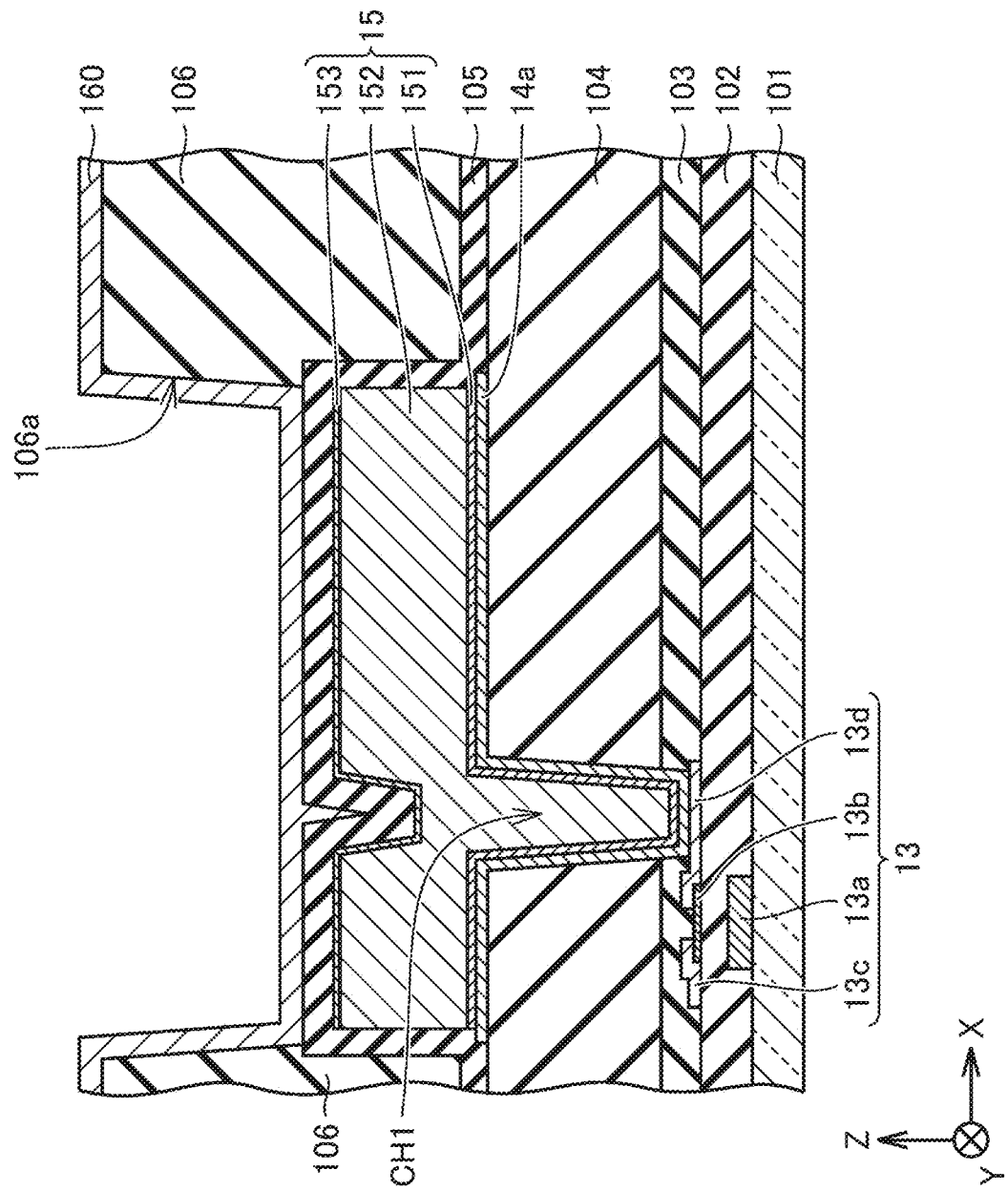
FIG. 5L is a sectional view illustrating a step of forming a metal film serving as a bias wire.
Figure 5M:
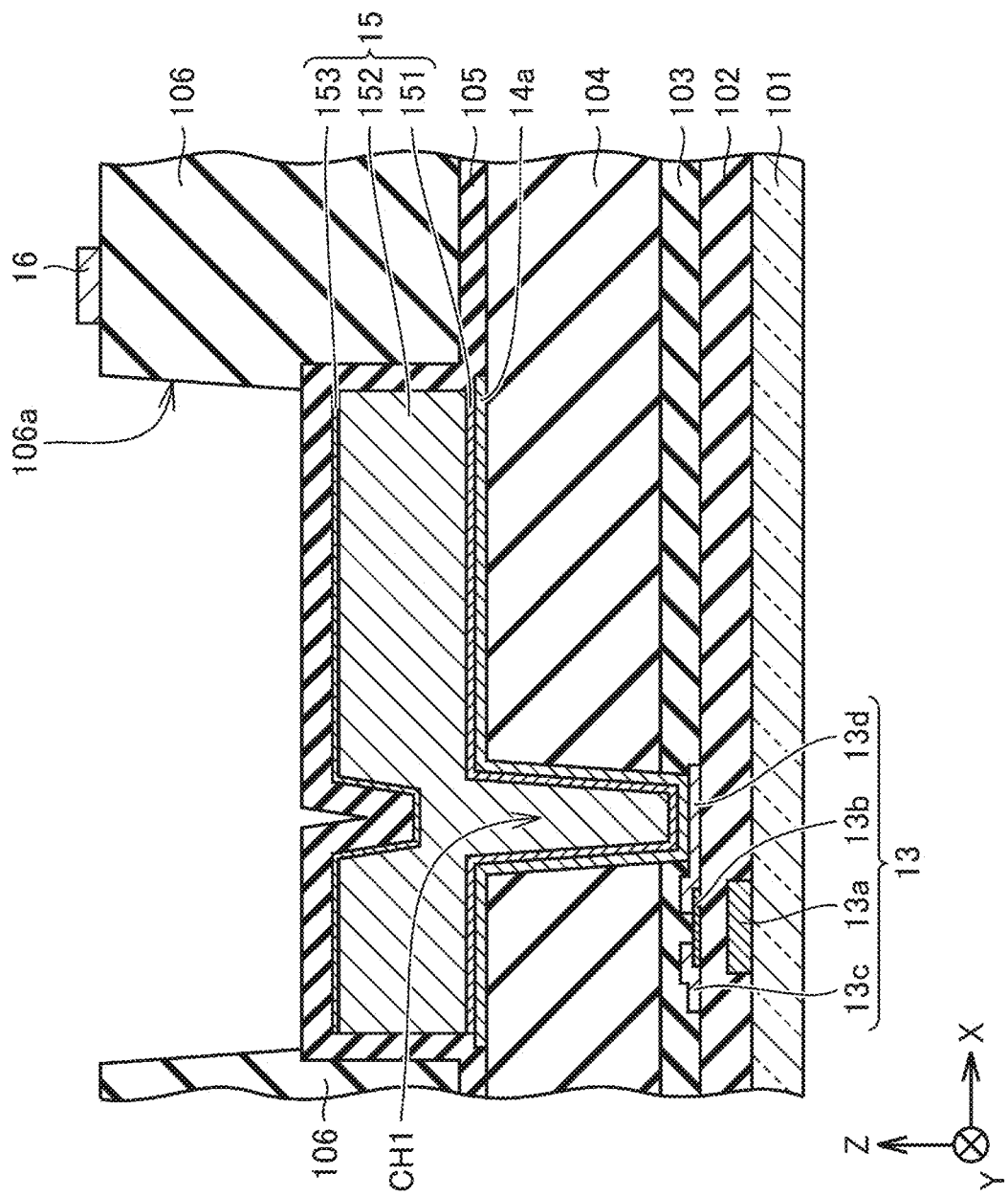
FIG. 5M is a sectional view illustrating a step of forming a bias wire.
Figure 5N:
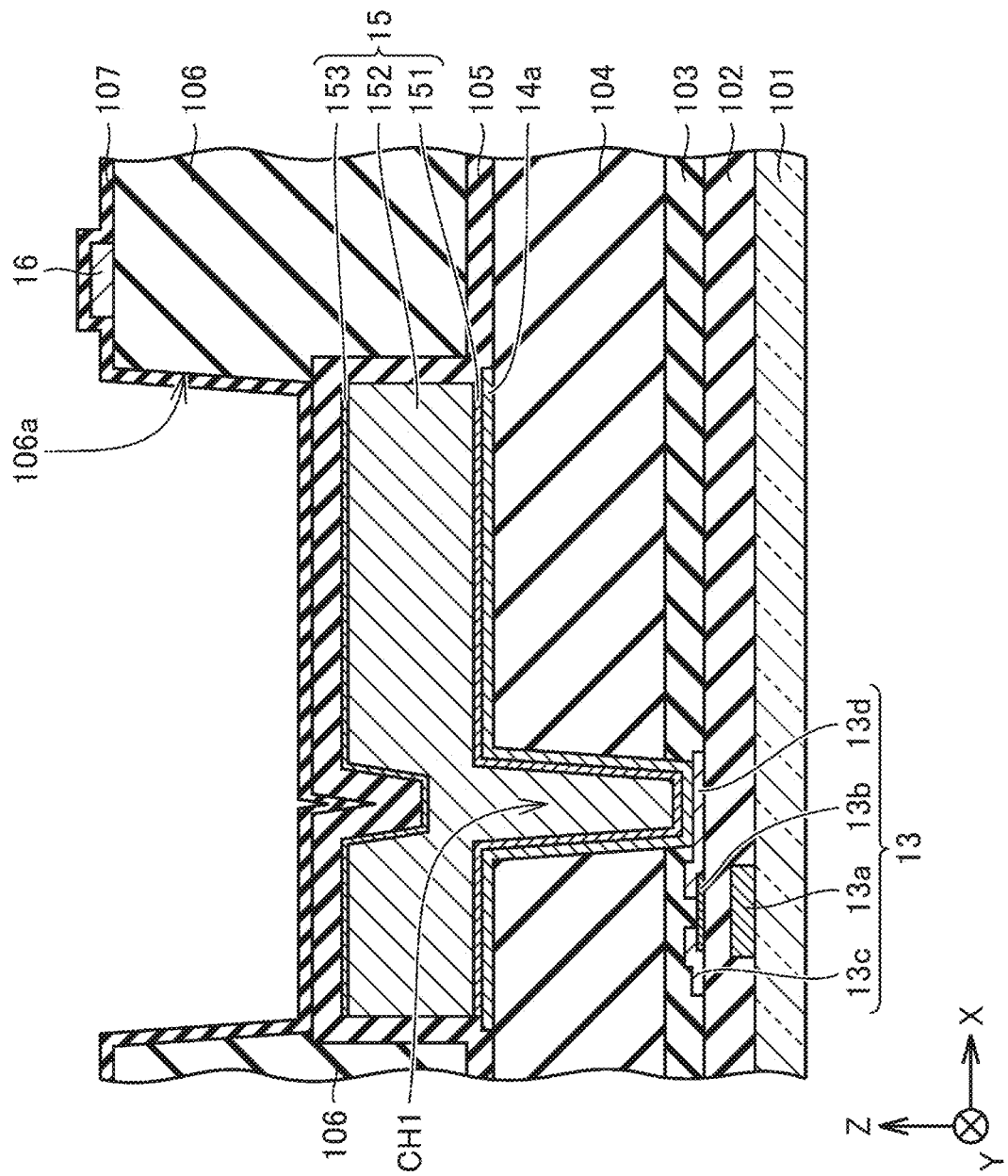
FIG. 5N is a sectional view illustrating a step of forming an inorganic insulating film serving as a protection film.
Figure 50:
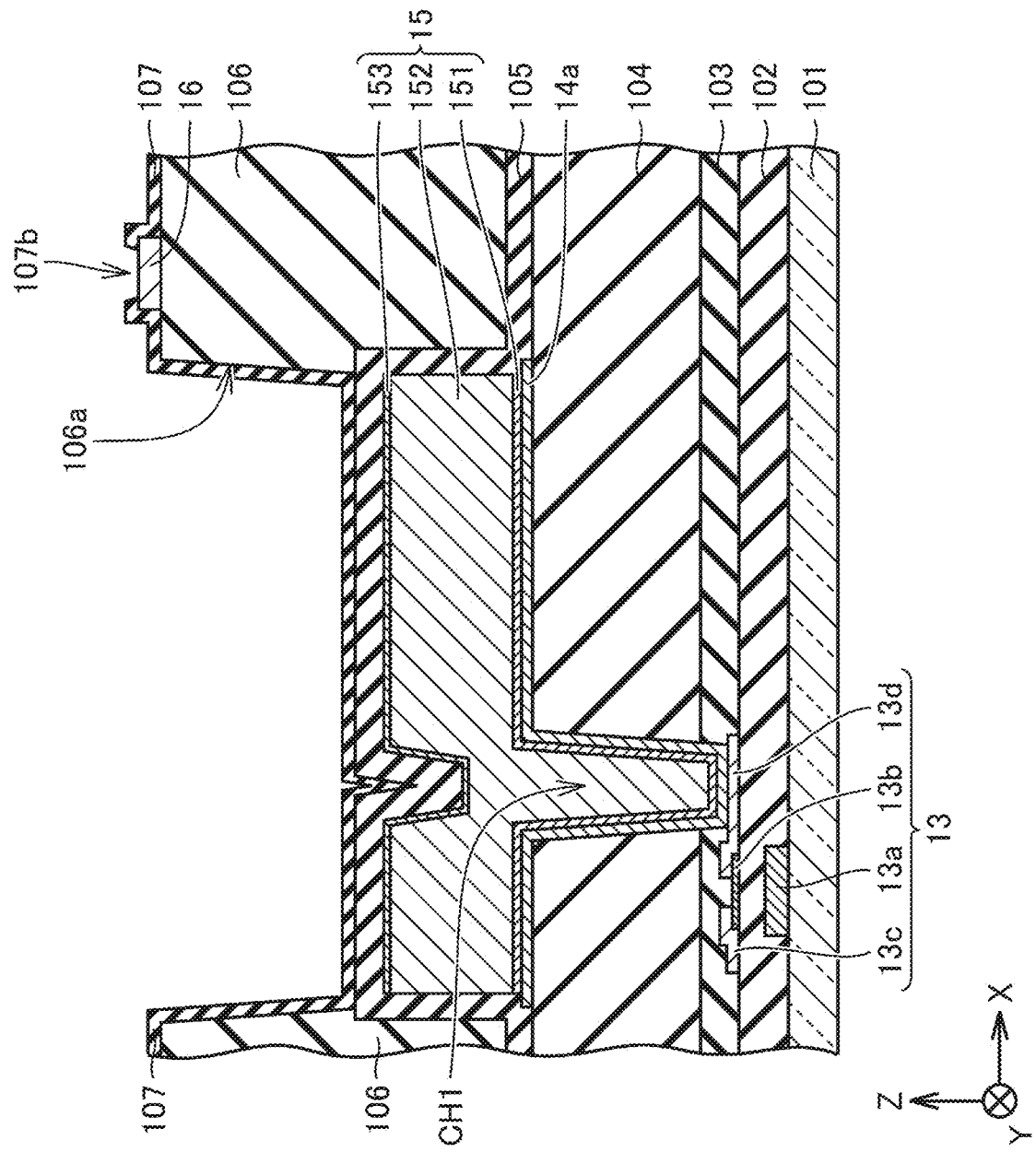

The structure of the pixel in the imaging panel 1 has been described above. Next, a method for producing an imaging panel 1 will be described. FIG. 5A to FIG. 5T are sectional views (taken along line V-V in FIG. 3) in the production process of a pixel of the imaging panel 1.

As illustrated in FIG. 5A, first, a gate insulating film 102 and a TFT 13 are formed on a substrate 101 by a known method. Then, a first insulating film 103 formed of silicon nitride (SiN) is formed on the source electrode 13c and drain electrode 13d of the TFT 13 by a method such as a plasma CVD method.

Subsequently, the entire surface of the substrate 101 is subjected to heat treatment at about 350° C. The first insulating film 103 is patterned by performing a photolithography method and wet etching to form an opening 103a above the drain electrode 13d (refer to FIG. 5B).

Subsequently, a second insulating film 104 formed of acrylic resin or siloxane resin is formed on the first insulating film 103 by, for example, a slit coating method (refer to FIG. 5C).

An opening 104a of the second insulating film 104 is then formed by a photolithography method so as to overlap the opening 103a in plan view. Thus, a contact hole CH1 constituted by the openings 103a and 104a is formed (refer to FIG. 5D).

Subsequently, a metal film 140 formed of molybdenum nitride (MoN) is formed on the second insulating film 104 by, for example, a sputtering method (refer to FIG. 5E).

The metal film 140 is then patterned by performing a photolithography method and wet etching. As a result, a lower electrode 14a connected to the drain electrode 13d through the contact hole CH1 is formed (refer to FIG. 5F).

Subsequently, an n-type amorphous semiconductor layer 151, an intrinsic amorphous semiconductor layer 152, and a p-type amorphous semiconductor layer 153 are formed on the second insulating film 104 and the lower electrode 14a in this order by, for example, a plasma CVD method (refer to FIG. 5G).

The n-type amorphous semiconductor layer 151, the intrinsic amorphous semiconductor layer 152, and the p-type amorphous semiconductor layer 153 are patterned by performing a photolithography method and dry etching. As a result, a photoelectric conversion layer 15 is formed (refer to FIG. 5H).

Subsequently, a third insulating film 105 formed of silicon nitride (SiN) is formed on the photoelectric conversion layer 15 by, for example, a plasma CVD method (refer to FIG. 5I).

Subsequently, a fourth insulating film 106 formed of acrylic resin or siloxane resin is formed on the third insulating film 105 by, for example, a slit coating method (refer to FIG. 5J).

Subsequently, an opening 106a of the fourth insulating film 106 is formed by a photolithography method at a position that overlaps the photoelectric conversion layer 15 in plan view (refer to FIG. 5K).

Subsequently, films of molybdenum nitride (MoN), aluminum (Al), and molybdenum nitride (MoN) are formed on the fourth insulating film 106 and the third insulating film 105 in this order by, for example, a sputtering method to form a metal film 160 (refer to FIG. 5L).

Subsequently, the metal film 160 is patterned by performing a photolithography method and wet etching. Thus, a bias wire 16 is formed at a position that does not overlap the photoelectric conversion layer 15 in plan view (refer to FIG. 5M).

Subsequently, a protection film 107 formed of silicon nitride (SiN) is formed on the bias wire 16 and the third insulating film 105 by, for example, a plasma CVD method (refer to FIG. 5N).

Subsequently, the protection film 107 is patterned by performing a photolithography method and wet etching. Thus, an opening 107b of the protection film 107 is formed above the bias wire 16 (refer to FIG. 5O).

Subsequently, the protection film 107 and the third insulating film 105 are simultaneously patterned by performing a photolithography method and wet etching. In this example, hydrofluoric acid is used as an etchant for wet etching. Thus, an opening 107a of the protection film 107 and an opening 105a of the third insulating film 105 are formed at a position that overlaps the photoelectric conversion layer 15 in plan view (refer to FIG. 5P). Herein, the opening width of the opening 107a of the protection film 107 is equal to or larger than the opening width of the opening 105a of the third insulating film 105.

Figure 5P:
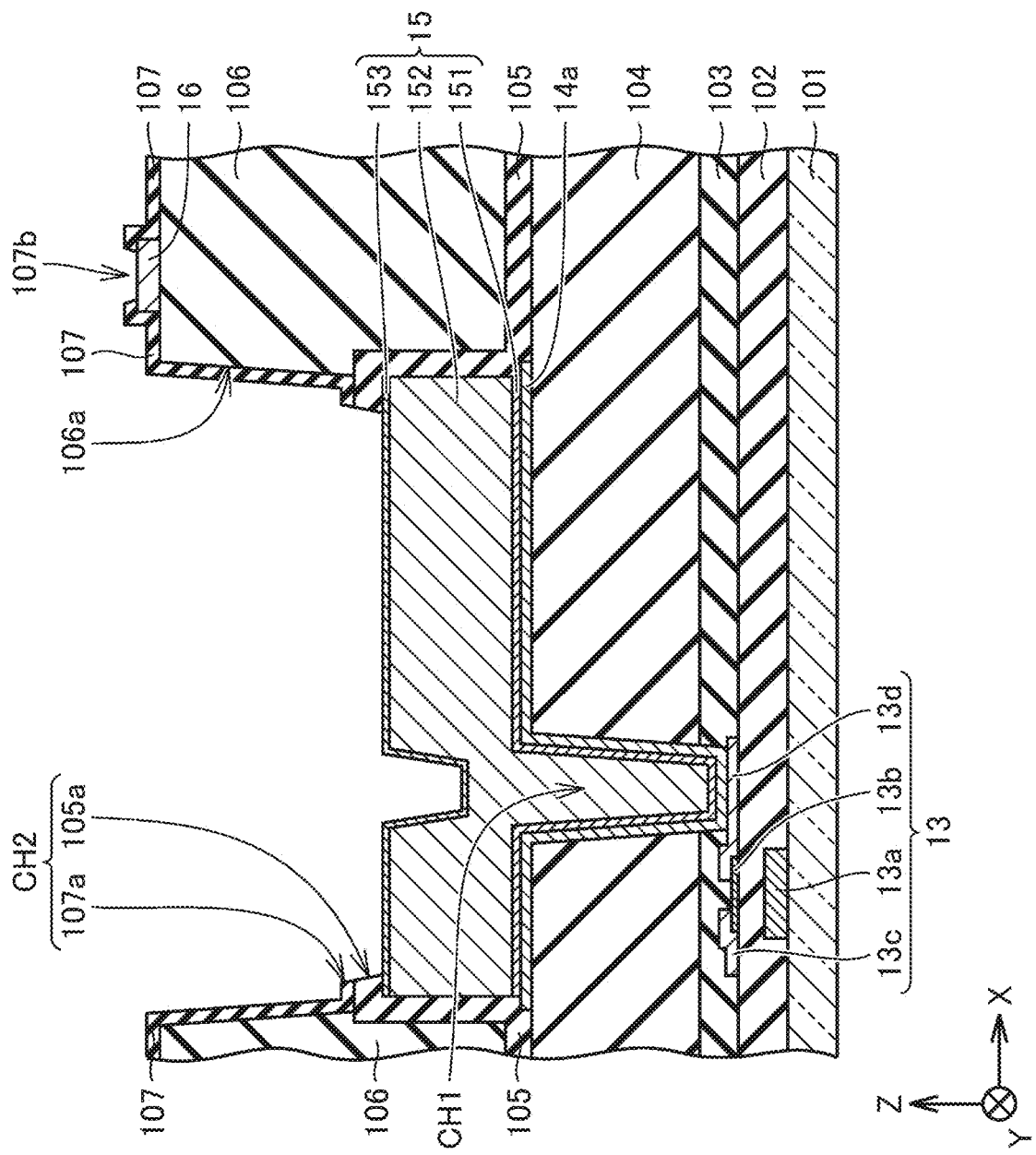
FIG. 5P is a sectional view illustrating a step of patterning the protection film to form an opening of the protection film above the photoelectric conversion layer.

In the step in FIG. 5P, if a native oxide film adheres to the surface of the p-type amorphous semiconductor layer 153 of the photoelectric conversion layer 15, such a native oxide can be removed by the wet etching. Therefore, generation of leakage current in the photoelectric conversion layer 15 can be suppressed compared with the case where a native oxide that adheres to the surface of the photoelectric conversion layer 15 is not removed.

When the step in FIG. 5P is performed, the inner surface of the opening 106a of the fourth insulating film 106 and a part of the upper surface of the third insulating film 105 that is not covered with the fourth insulating film 106 are covered with the protection film 107. In this example, the third insulating film 105 and the protection film 107 are formed of the same material, and thus the third insulating film 105 and the protection film 107 have the same etching rate upon etching with hydrofluoric acid. Therefore, the end of the protection film 107 on the contact hole CH2 side does not readily protrude further than the third insulating film 105 as a result of the etching with hydrofluoric acid.

As a result of the wet etching in the step in FIG. 5P, the surface of the bias wire 16 located inside the opening 107b is exposed to hydrofluoric acid. However, molybdenum nitride (MoN) having resistance to hydrofluoric acid is disposed in the uppermost layer of the bias wire 16. Therefore, the upper surface of the bias wire 16 is not easily etched through the wet etching. Furthermore, since the side surfaces of the bias wire 16 are covered with the protection film 107, the side surfaces of the bias wire 16 are not etched. Therefore, the side surfaces of the bias wire 16 are not etched, which suppresses an increase in the resistance of the bias wire 16 compared with the case where the protection film 107 is not disposed.

Figure 5Q:
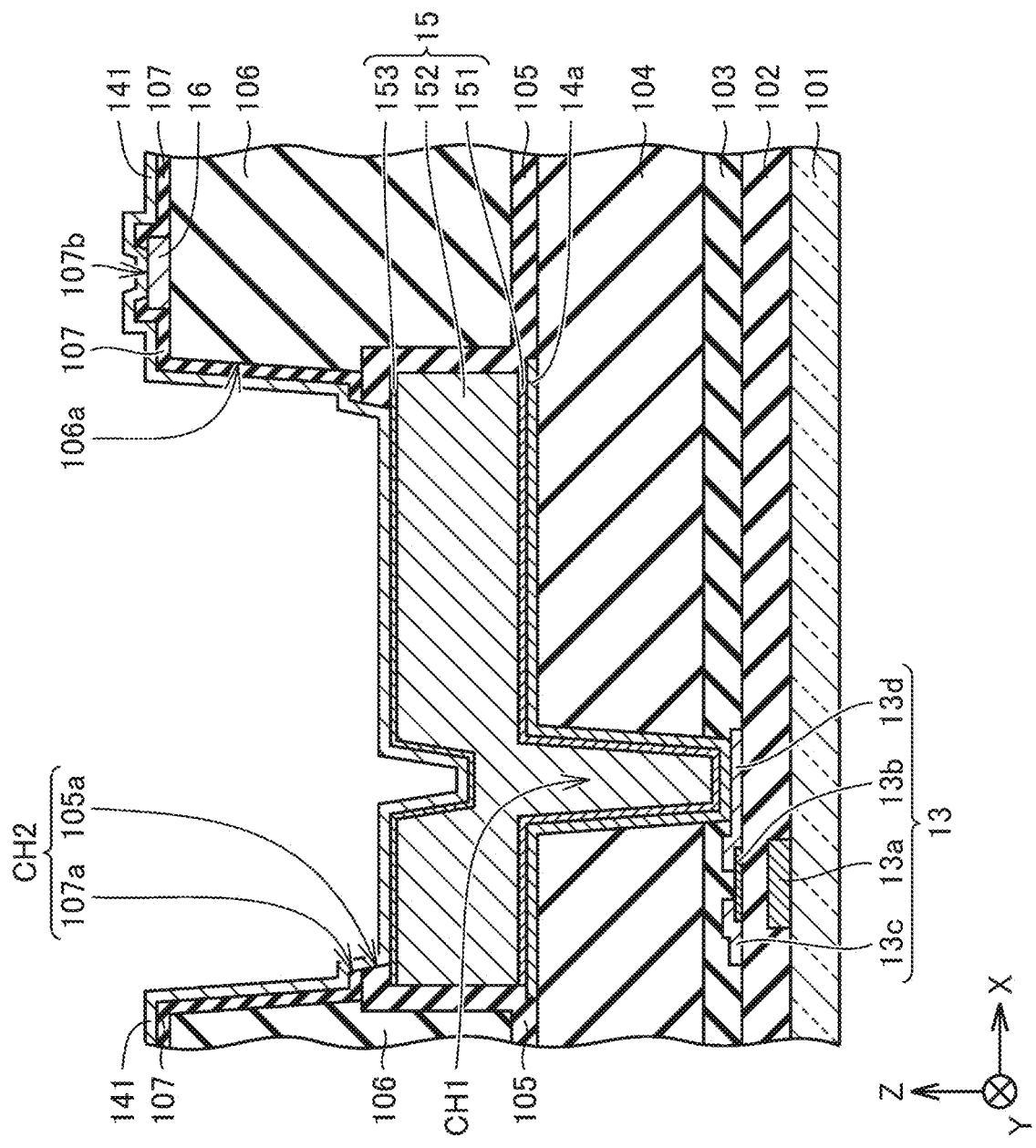
FIG. 5Q is a sectional view illustrating a step of forming a transparent conductive film serving as an upper electrode.

Subsequently, after the step in FIG. 5P, a transparent conductive film 141 formed of ITO is formed on the protection film 107 and the bias wire 16 by, for example, a sputtering method (refer to FIG. 5Q). The transparent conductive film 141 is then patterned by performing a photolithography method and dry etching. Thus, an upper electrode 14b that is in contact with the photoelectric conversion layer 15 through the contact hole CH2 and the bias wire 16 through the opening 107b is formed (refer to FIG. 5R).

Figure 5R:
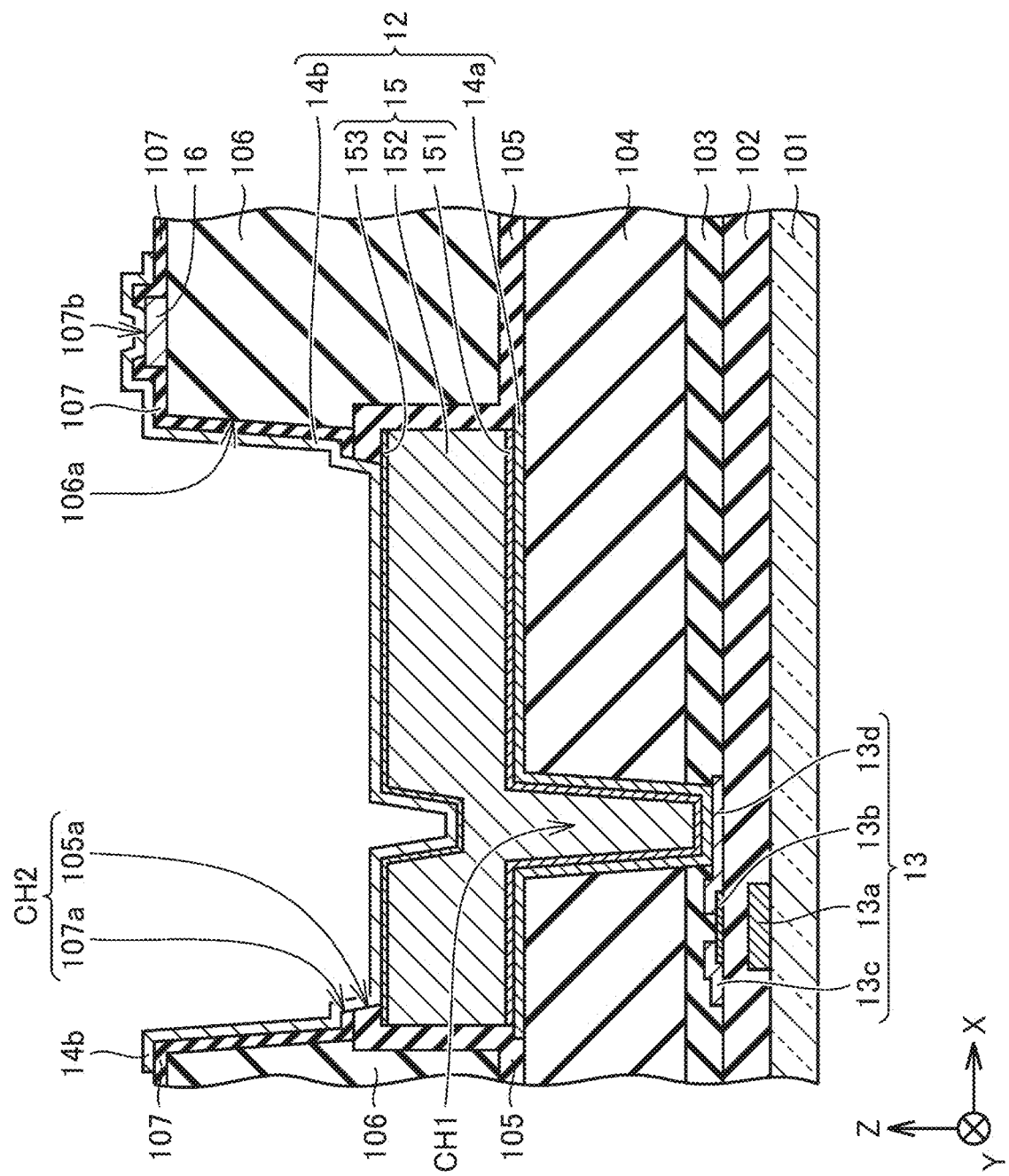
FIG. 5R is a sectional view illustrating a step of patterning the transparent conductive film to form an upper electrode.

In the above-described step in FIG. 5P, the end of the protection film 107 on the contact hole CH2 side does not protrude further than the third insulating film 105. Therefore, even when the steps in FIGS. 5Q and 5R are performed, discontinuous formation of the transparent conductive film 141 is suppressed inside the contact hole CH2. This enables appropriate application of a bias voltage from the bias wire 16 to the photoelectric conversion layer 15 through the upper electrode 14b.

Figure 5S:
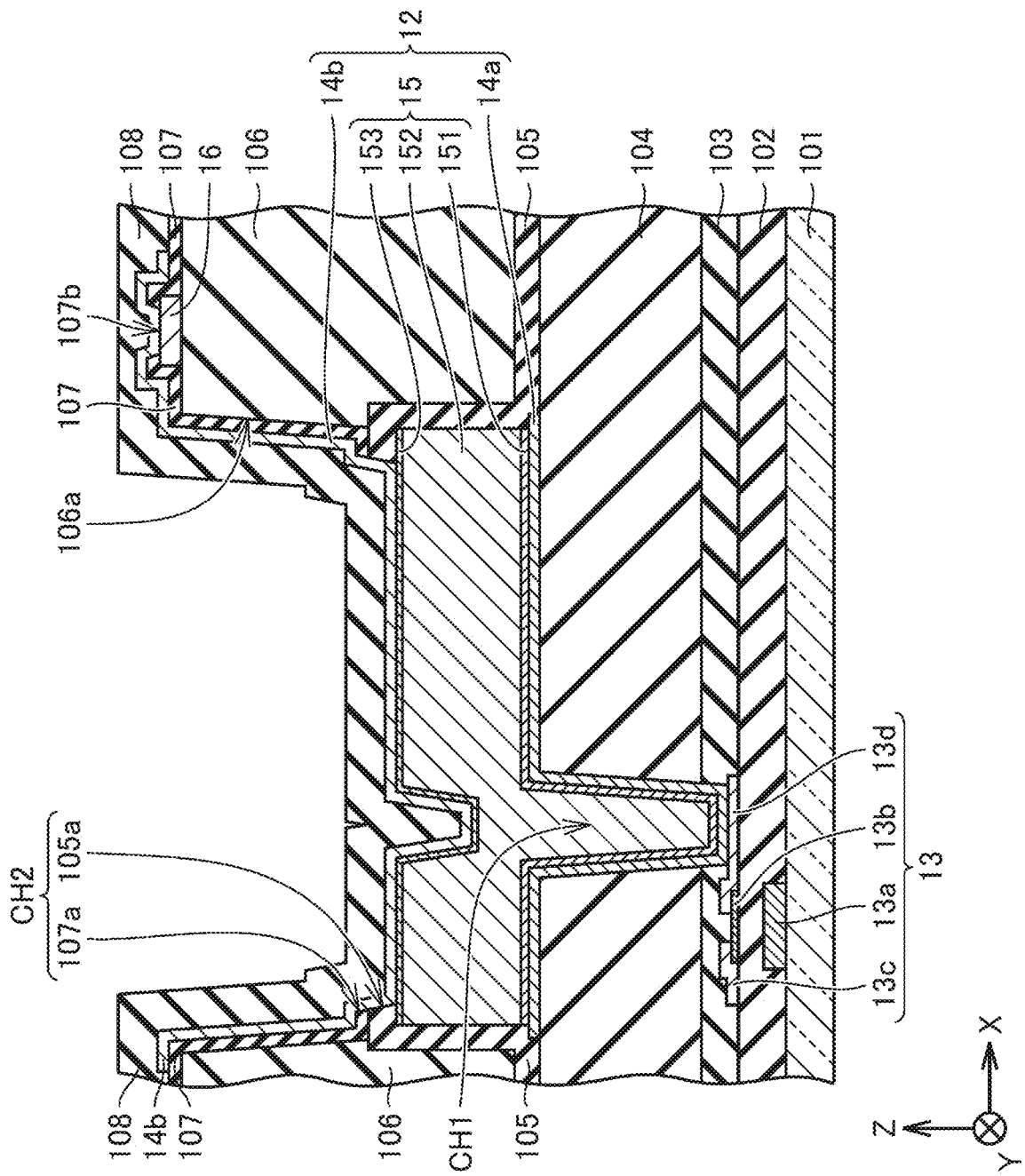
FIG. 5S is a sectional view illustrating a step of forming a fifth insulating film.
Figure 5T:
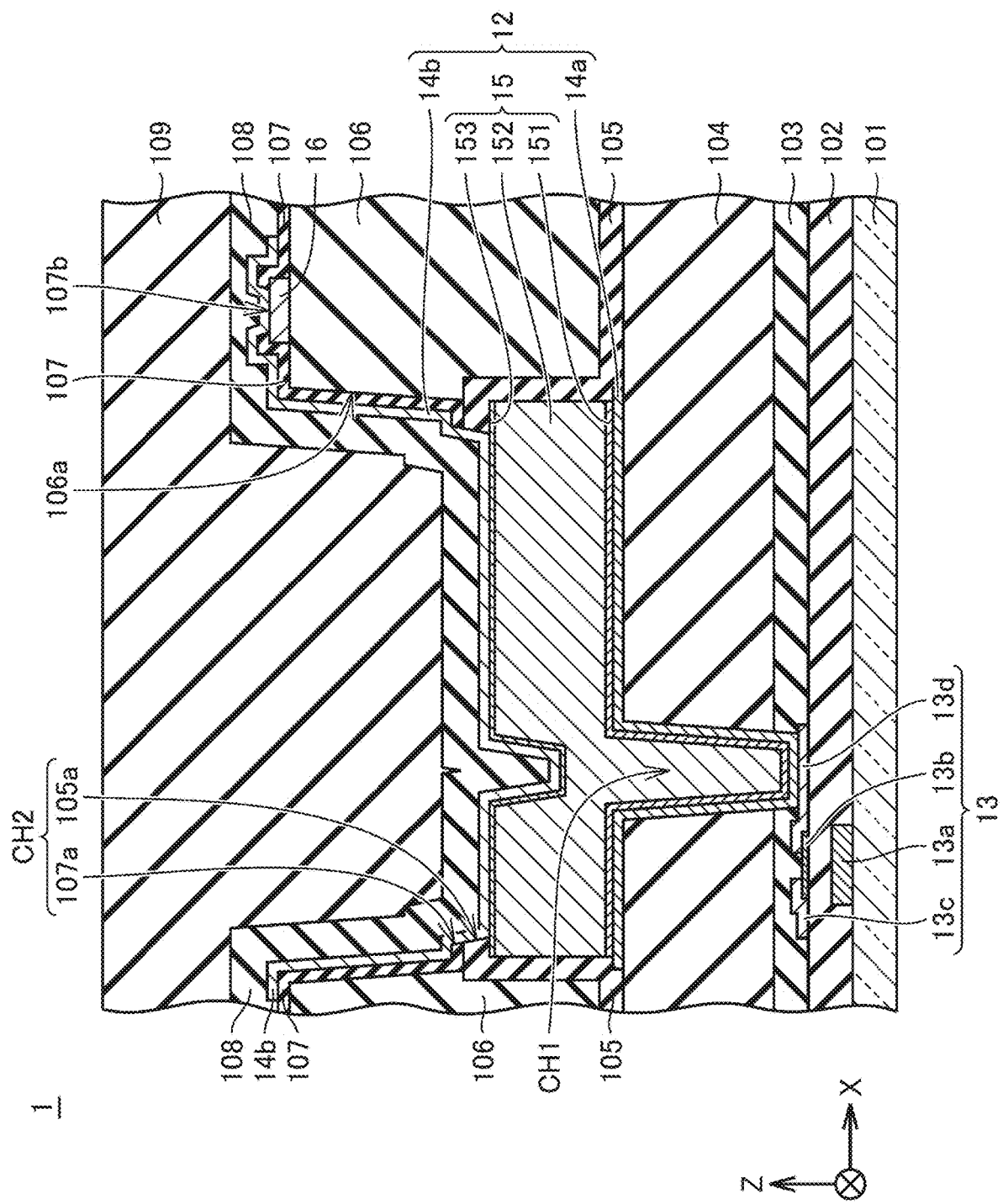
FIG. 5T is a sectional view illustrating a step of forming a sixth insulating film.

Subsequently, a fifth insulating film 108 formed of silicon nitride (SiN) is formed on the upper electrode 14b and the protection film 107 by, for example, a plasma CVD method (refer to FIG. 5S).

Subsequently, a sixth insulating film 109 formed of acrylic resin or siloxane resin is formed on the fifth insulating film 108 by, for example, a slit coating method (refer to FIG. 5T). The method for producing an imaging panel 1 has been described above.

Operation of X-Ray Imaging Device 100

An operation of the X-ray imaging device 100 illustrated in FIG. 1 will be described. First, X-rays are applied from the X-ray source 3. At this time, the controller 2 applies a predetermined bias voltage to the bias wires 16 (refer to, for example, FIG. 3). The X-rays applied from the X-ray source 3 pass through the subject S and enter the scintillator 1A. The X-rays that have entered the scintillator 1A are converted into fluorescence (scintillation light), and the scintillation light enters the imaging panel 1. When the scintillation light enters the photodiode 12 disposed in each pixel of the imaging panel 1, the scintillation light is converted into a charge based on the amount of the scintillation light. A gate voltage (positive voltage) output from the gate controlling unit 2A through the gate wire 11 brings the TFT 13 (refer to, for example, FIG. 3) to an ON-state. When the TFT 13 is in an ON-state, a signal based on the charge obtained by conversion at the photodiode 12 in the pixel in which the TFT 13 is disposed is read out to the signal reading unit 2B (refer to, for example, FIG. 2) through the source wire 10 in the pixel. An X-ray image based on the read signal is generated in the controller 2.

Modification

The method for producing an imaging panel 1 is not limited to the above-described method according to the first embodiment. Hereafter, a production method different from that in the first embodiment will be described.

In the above-described production method according to the first embodiment, the opening 107a and the opening 107b of the protection film 107 are formed in different steps (FIGS. 5O and 5P). In this modification, a method in which the opening 107a and the opening 107b are formed in the same step will be described. Hereafter, production steps different from those in the first embodiment will be mainly described.

In this modification, first, the protection film 107 is formed by performing the above-described steps in FIGS. 5A to 5N. Then, the protection film 107 is patterned by performing a photolithography method and wet etching. At this time, the opening 107a of the protection film 107 is formed at a position that overlaps the photoelectric conversion layer 15 in plan view while the opening 107b of the protection film 107 is formed at a position that overlaps the bias wire 16 in plan view (refer to FIG. 6). By simultaneously forming the opening 107a and the opening 107b in the same step as described above, a photomask and a production step can be omitted compared with the case where the opening 107a and the opening 107b are formed in different steps.

Figure 6:
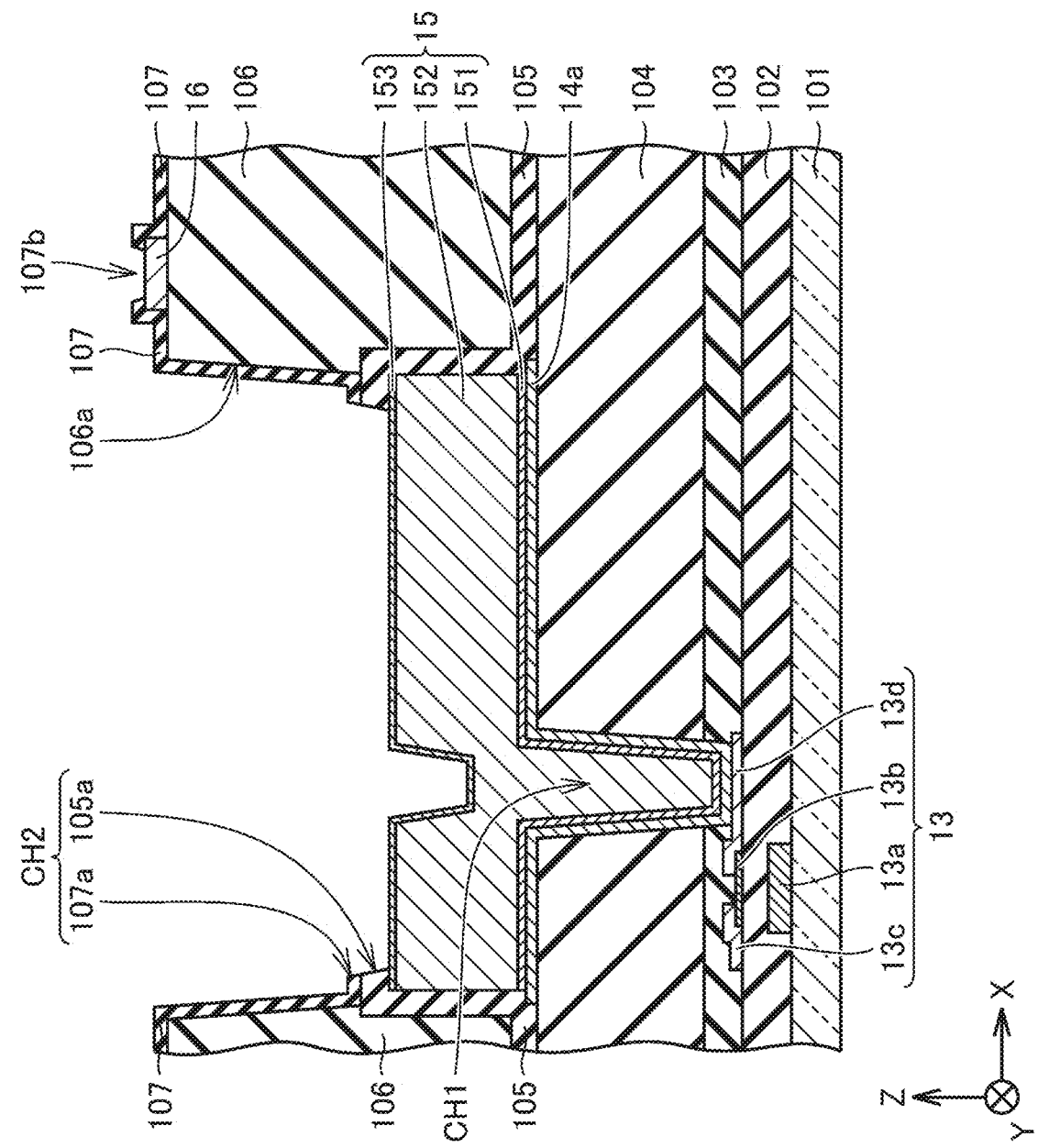
FIG. 6 is a sectional view for describing the production process of an imaging panel according to a modification of the first embodiment, and is a sectional view illustrating a state in which an opening of a protection film is formed.

After the step in FIG. 6, the above-described steps in FIGS. 5Q to 5T are performed to form an imaging panel 1.

Second Embodiment

In the above-described first embodiment, an etchant containing hydrofluoric acid is used during wet etching for forming the opening 107a and the opening 107b, and thus a native oxide that adheres to the surface of the photoelectric conversion layer 15 is removed to some extent. However, such a native oxide is desirably not left on the surface of the photoelectric conversion layer 15 before formation of the upper electrode 14b. In this embodiment, therefore, cleaning treatment is performed on the surface of the photoelectric conversion layer 15 before formation of the upper electrode 14b to remove a native oxide left on the surface of the photoelectric conversion layer 15. Hereafter, production steps different from those in the first embodiment will be mainly described.

Figure 7:
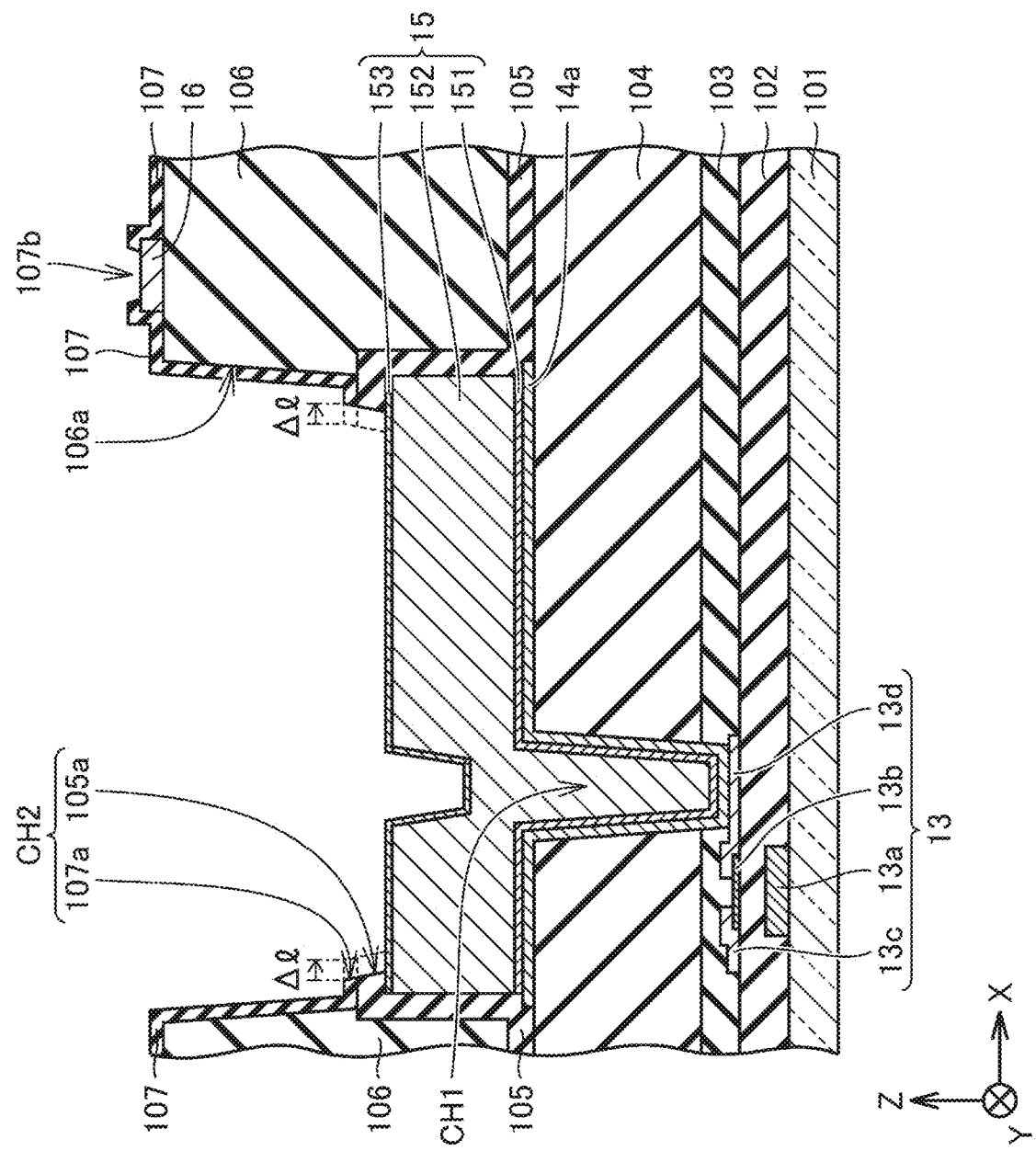
FIG. 7 is a sectional view for describing the production process of an imaging panel according to a second embodiment, and is a sectional view illustrating a state in which cleaning treatment is performed on the surface of a photoelectric conversion layer.

In this embodiment, first, the above-described steps in FIGS. 5A to 5P in the first embodiment are performed to form an opening 107b. Then, the surface of the photoelectric conversion layer 15 is cleaned using an etchant containing hydrofluoric acid (refer to FIG. 7). This cleaning treatment also contributes to etching the third insulating film 105 and the end of the protection film 107 on the contact hole CH2 side. Consequently, as illustrated in FIG. 7, each of the opening widths of the opening 105a of the third insulating film 105 and the opening 107a of the protection film 107 increases by a length of $\Delta 1$ with respect to the opening widths before the cleaning treatment.

Subsequently, the above-described steps in FIGS. 5Q to 5T are performed to form an imaging panel 1.

In the second embodiment, cleaning treatment is performed on the surface of the photoelectric conversion layer 15 before formation of the upper electrode 14b. This suppresses generation of leakage current in the photoelectric conversion layer 15 compared with the case where cleaning treatment is not performed before formation of the upper electrode 14b. The opening widths of the opening 105a and the opening 107a increase after the cleaning treatment with respect to the opening widths before the cleaning treatment. However, the protection film 107 and the third insulating film 105 are formed of the same material and thus have the same etching rate upon etching with hydrofluoric acid. Therefore, even when the cleaning treatment is performed, the end of the protection film 107 on the contact hole CH2 side does not readily protrude further than the third insulating film 105. This suppresses discontinuous formation of the transparent conductive film 141 in the contact hole CH2 when the step in FIG. 5Q is performed after the cleaning treatment, and thus suppresses contact failure between the upper electrode 14b and the photoelectric conversion layer 15.

Modification

In the above-described second embodiment, the opening 107a and the opening 107b of the protection film 107 are formed in different steps, but the opening 107a and the opening 107b may be formed in the same step as in the modification of the first embodiment.

Also in this case, after the step of forming the opening 107a and the opening 107b (refer to FIG. 6), cleaning treatment is performed on the surface of the photoelectric conversion layer 15 as in the second embodiment. By performing the cleaning treatment, a native oxide that adheres to the surface of the photoelectric conversion layer 15 is removed, which can suppress generation of leakage current in the photoelectric conversion layer 15.

After the cleaning treatment, the above-described steps in FIGS. 5Q to 5T are performed to form an imaging panel 1.

The embodiments of the present disclosure have been described, but the above-described embodiments are mere examples for carrying out the present disclosure. Therefore, the present disclosure is not limited to the above-described embodiments, and the above-described embodiments can be appropriately modified without departing from the spirit of the present disclosure. Hereafter, modifications of the present disclosure will be described.

(1) In the above-described first embodiment and second embodiment, the structure in which the protection film 107 covers the side surfaces of the bias wire 16 of the photoelectric conversion layer 15 has been described, but the structure of the protection film 107 is not limited thereto. It is sufficient that an upper portion of the third insulating film 105 that is not covered with the fourth insulating film 106 is at least covered with the protection film 107.

(2) In the above-described first embodiment and second embodiment, an example in which the bias wire 16 has a three-layer structure including three metal films formed on top of one another has been described, but the bias wire 16 may have a two-layer structure. In the case of the two-layer structure, for example, the lower layer may be a metal film formed of aluminum and the upper layer may be a metal film formed of molybdenum nitride. In other words, when a metal film formed of aluminum or the like having low resistance to etching with an acid such as hydrofluoric acid is used for the bias wire 16, a metal film having resistance to an acid such as hydrofluoric acid is desirably formed as an upper layer of the metal film formed of aluminum or the like. In this configuration, even if the surface of the bias wire 16 at the opening 107b of the protection film 107 is exposed to an etchant containing hydrofluoric acid, the bias wire 16 is not easily etched.

(3) In the above-described embodiments, when the opening 107a of the protection film 107 and the opening 105a of the third insulating film 105 are formed or when the surface of the photoelectric conversion layer 15 is cleaned, an etchant containing hydrofluoric acid is used. However, the material for the etchant is not limited thereto. Any etchant containing an acid that can etch the protection film 107 and the third insulating film 105 and that can remove a native oxide which adheres to the surface of the photoelectric conversion layer 15 may be used.

(4) In the above-described embodiments, an example in which the third insulating film 105 and the protection film 107 are formed of the same material has been described. However, the third insulating film 105 and the protection film 107 may be formed of different materials. That is, it is sufficient that the protection film 107 is an inorganic insulating film whose etching rate upon etching with an etchant containing hydrofluoric acid or the like is equal to or higher than that of the third insulating film 105.

(5) In the above-described embodiments, the entire surface of the fourth insulating film 106 may be covered with the protection film 107. Since the fourth insulating film 106 is an organic insulating film, moisture more readily infiltrates into the fourth insulating film 106 than into the inorganic insulating film. Therefore, when the entire surface of the fourth insulating film 106 is covered with the protection film 107, moisture does not readily infiltrate into the imaging panel 1 from the outside, which suppresses flow of leakage current in the photodiode 12.

The above-described imaging panel and method for producing an imaging panel can be described as follows.

An imaging panel includes a photoelectric conversion layer; an inorganic insulating film partly covering a surface of the photoelectric conversion layer and having a first opening at a position that overlaps the photoelectric conversion layer in plan view; an organic insulating film partly covering a surface of the inorganic insulating film and having a second opening that overlaps the first opening in plan view and that has a larger opening width than the first opening; a protection film covering a portion of the inorganic insulating film, the portion being not covered with the organic insulating film, at an inside of the second opening; and an electrode covering the protection film and a surface of the photoelectric conversion layer at an inside of the first opening, wherein the protection film has an etching rate equal to or higher than that of the inorganic insulating film upon etching with an etchant containing an acid (first configuration).

According to the first configuration, the surface of the photoelectric conversion layer is partly covered with the inorganic insulating film, and the surface of the inorganic insulating film is partly covered with the organic insulating film. The first opening of the inorganic insulating film and the second opening of the organic insulating film are formed above the photoelectric conversion layer. The second opening has a larger opening width than the first opening, and a portion of the inorganic insulating film, the portion being not covered with the organic insulating film, is covered with the protection film at the inside of the second opening. The electrode covers the surface of the photoelectric conversion layer at the first opening and also covers the protection film.

When an imaging panel is produced, the surface of the photoelectric conversion layer is sometimes cleaned using hydrofluoric acid or the like before formation of the electrode in order to suppress generation of leakage current in the photoelectric conversion layer. In the case where the protection film is not disposed, if the inorganic insulating film is etched as a result of cleaning treatment, the organic insulating film tends to protrude further than the inorganic insulating film. In contrast, in the first configuration, the protection film is disposed on a portion of the inorganic insulating film that is not covered with the organic insulating film, and the etching rate of the protection film upon etching with an etchant containing an acid is equal to or higher than that of the inorganic insulating film. Therefore, the inorganic insulating film does not readily protrude further than the protection film and the organic insulating film as a result of the cleaning with hydrofluoric acid or the like. This suppresses discontinuous formation of the electrode at the inside of the first opening and the second opening, and thus suppresses contact failure between the photoelectric conversion layer and the electrode.

In the first configuration, the imaging panel may further include a bias wire disposed on the organic insulating film at a position that does not overlap the photoelectric conversion layer in plan view. The protection film may have a bias wire-connecting opening at a position that overlaps the bias wire in plan view and may cover side surfaces of the bias wire. The electrode may be connected to the bias wire through the bias wire-connecting opening (second configuration).

According to the second configuration, the side surfaces of the bias wire are covered with the protection film, and the bias wire-connecting opening for connecting the electrode and the bias wire is formed above the bias wire. In the case where the side surfaces of the bias wire are not covered with the protection film, if the photoelectric conversion layer is cleaned using hydrofluoric acid or the like before formation of the electrode, the bias wire may be etched through the cleaning treatment. In contrast, when the side surfaces of the bias wire are covered with the protection film as in this configuration, the side surfaces of the bias wire are not etched through the cleaning treatment, which can suppress an increase in the resistance of the bias wire.

In the second configuration, the bias wire may have a multilayer structure including a plurality of metal films. Among the plurality of metal films, a metal film disposed at an outermost surface opposite to the organic insulating film may be formed of a metal material having acid resistance (third configuration).

According to the third configuration, when the bias wire has a multilayer structure including a plurality of metal films, a metal film disposed at an outermost surface opposite to the organic insulating film has acid resistance. Therefore, even when an etchant containing hydrofluoric acid or the like is used for cleaning the surface of the photoelectric conversion layer before formation of the electrode in the production of an imaging panel, the surface of the bias wire that is not covered with the protection film is not easily etched.

In any of the first to third configurations, the protection film may cover an entire surface of the organic insulating film (fourth configuration).

According to the fourth configuration, the entire surface of the organic insulating film is covered with the protection film. Therefore, moisture does not readily infiltrate into the imaging panel from the outside, which suppresses generation of leakage current in the photoelectric conversion layer.

A method for producing an imaging panel includes a step of forming a photoelectric conversion layer on a substrate; a step of forming an inorganic insulating film on the photoelectric conversion layer; a step of forming an organic insulating film on the inorganic insulating film and forming an opening of the organic insulating film at a position that overlaps the photoelectric conversion layer in plan view; a step of forming a protection film covering surfaces of the inorganic insulating film and the organic insulating film; a step of forming a contact hole that overlaps the photoelectric conversion layer in plan view, has an opening width smaller than that of the opening of the organic insulating film, and extends through the inorganic insulating film and the protection film; and a step of forming an electrode covering a surface of the photoelectric conversion layer at the contact hole and partly covering a surface of the protection film, wherein the protection film has an etching rate equal to or higher than that of the inorganic insulating film upon etching with an etchant containing an acid, and the contact hole is formed by etching the inorganic insulating film and the protection film using the etchant (first production method).

According to the first production method, the surface of the photoelectric conversion layer is partly covered with the inorganic insulating film, the surface of the inorganic insulating film is partly covered with the organic insulating film, and the opening of the organic insulating film and the contact hole that extends through the inorganic insulating film and the protection film are formed above the photoelectric conversion layer. The contact hole is formed by etching the inorganic insulating film and the protection film using an etchant containing hydrofluoric acid. Since the etching rate of the protection film upon etching with an etchant containing an acid is equal to or higher than that of the inorganic insulating film, the inorganic insulating film does not readily protrude further than the organic insulating film and the protection film through the etching. This suppresses discontinuous formation of the electrode at the inside of the contact hole, and thus suppresses contact failure between the photoelectric conversion layer and the electrode at the inside of the contact hole.

The first production method may further include a step of cleaning a surface of the photoelectric conversion layer before formation of the electrode (second production method).

According to the second production method, a native oxide that adheres to the surface of the photoelectric conversion layer can be removed by performing cleaning treatment. Furthermore, even when an etchant containing hydrofluoric acid or the like is used during cleaning treatment and thus the inorganic insulating film and the protection film are etched, the inorganic insulating film does not readily protrude further than the organic insulating film and the protection film.

The first or second production method may further include a step of forming, after formation of the organic insulating film, a bias wire on the organic insulating film at a position that does not overlap the photoelectric conversion layer in plan view; and a step of forming, after formation of the protection film, a bias wire-connecting opening at a position that overlaps the bias wire in plan view. The electrode may be connected to the bias wire through the bias wire-connecting opening (third production method).

According to the third production method, the bias wire is formed at a position that does not overlap the photoelectric conversion layer in plan view. This can increase the amount of light that enters the photoelectric conversion layer compared with the case where the bias wire is formed at a position that overlaps the photoelectric conversion layer in plan view.

In the third production method, the step of forming a contact hole and the step of forming a bias wire-connecting opening may be simultaneously performed (fourth production method).

According to the fourth production method, the contact hole and the bias wire-connecting opening are simultaneously formed. Therefore, the number of production steps performed to produce an imaging panel can be reduced compared with the case where the contact hole and the bias wire-connecting opening are separately formed.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging panel comprising:
    a photoelectric conversion layer;
    an inorganic insulating film partly covering a surface of the photoelectric conversion layer and having a first opening at a position that overlaps the photoelectric conversion layer in plan view;
    an organic insulating film partly covering a surface of the inorganic insulating film and having a second opening that overlaps the first opening in plan view and that has a larger opening width than the first opening;
    a protection film in direct contact with and covering a portion of the inorganic insulating film, the portion being not covered with the organic insulating film, at an inside of the second opening; and
    an electrode covering the protection film and a surface of the photoelectric conversion layer at an inside of the first opening,
    wherein the protection film has an etching rate equal to or higher than that of the inorganic insulating film upon etching with an etchant containing an acid.

2. The imaging panel according to claim 1, further comprising:
    a bias wire disposed on the organic insulating film at a position that does not overlap the photoelectric conversion layer in plan view,
    wherein the protection film has a bias wire-connecting opening at a position that overlaps the bias wire in plan view and covers side surfaces of the bias wire, and
    the electrode is connected to the bias wire through the bias wire-connecting opening.

3. The imaging panel according to claim 2,
    wherein the bias wire has a multilayer structure including a plurality of metal films, and
    among the plurality of metal films, a metal film disposed at an outermost surface opposite to the organic insulating film is formed of a metal material having acid resistance.

4. The imaging panel according to claim 1, wherein the protection film covers an entire surface of the organic insulating film.

* * * * *